United States Patent
Shimizu et al.

(10) Patent No.: US 11,307,567 B2
(45) Date of Patent: Apr. 19, 2022

(54) COMPONENT MOUNTING DEVICE, METHOD, AND SYSTEM THAT CONTROLS HEAD BASED ON DEGREE OF MALFUNCTION

(71) Applicant: PANASONIC INTELLECTUAL PROPERTY MANAGEMENT CO., LTD., Osaka (JP)

(72) Inventors: Taichi Shimizu, Osaka (JP); Yosuke Tajika, Hyogo (JP); Hiroshi Amano, Osaka (JP); Yuichi Higuchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/975,618

(22) PCT Filed: Feb. 22, 2019

(86) PCT No.: PCT/JP2019/006867
§ 371 (c)(1),
(2) Date: Aug. 25, 2020

(87) PCT Pub. No.: WO2019/167845
PCT Pub. Date: Sep. 6, 2019

(65) Prior Publication Data
US 2020/0401122 A1     Dec. 24, 2020

(30) Foreign Application Priority Data
Feb. 27, 2018  (JP) .............................. JP2018-033957

(51) Int. Cl.
G05B 23/02    (2006.01)
H05K 13/08    (2006.01)
(Continued)

(52) U.S. Cl.
CPC ......... *G05B 23/0259* (2013.01); *G06Q 10/20* (2013.01); *G06Q 50/04* (2013.01); *H05K 13/0812* (2018.08)

(58) Field of Classification Search
None
See application file for complete search history.

(56) References Cited

U.S. PATENT DOCUMENTS 6,467,158 B1 * 10/2002 Kiyomura .......... H05K 13/0409
                                                    29/740
2002/0042989 A1 * 4/2002 Kawase ............... H05K 13/041
                                                    29/832

(Continued)

FOREIGN PATENT DOCUMENTS

| JP | 5767754 B2 | 8/2015 |
| JP | 2015-211054 A | 11/2015 |
| WO | 2016/046967 A1 | 3/2016 |

OTHER PUBLICATIONS

International Search Report and Written Opinion dated May 21, 2019 in International Application No. PCT/JP2019/006867; with partial English translation.

*Primary Examiner* — Bernard G Lindsay
(74) *Attorney, Agent, or Firm* — McDermott Will & Emery LLP

(57) ABSTRACT

A management device for managing a component mounter that mounts components onto a substrate using some of constituent elements each selected from one of constituent element groups each including the constituent elements. One group is a nozzle group including nozzles. The device includes: a true displacement amount calculator that calculates, for each target component which is the component, a true amount of displacement which is a sum of (i) an amount of pickup displacement being an amount of displacement between the target component and a target nozzle being one (Continued)

of the nozzles and picks up the target component and (ii) an amount of correction being an amount of offset of a position of the target nozzle when picking up the target component; and a statistical processor that performs parameter estimation for a predetermined statistical model using the true amount to calculate a degree of malfunction of each constituent element.

10 Claims, 10 Drawing Sheets

(51) Int. Cl.
*G06Q 10/00* (2012.01)
*G06Q 50/04* (2012.01)

(56) References Cited

U.S. PATENT DOCUMENTS

| | | | |
|---|---|---|---|
| 2002/0056188 A1* | 5/2002 | Yamaguchi | H05K 13/0417 29/743 |
| 2009/0202143 A1* | 8/2009 | Mamiya | H05K 3/3485 382/150 |
| 2015/0307288 A1 | 10/2015 | Sumi | |
| 2018/0153062 A1* | 5/2018 | Sakurayama | H05K 13/0813 |
| 2020/0275590 A1* | 8/2020 | Nakayama | H05K 13/0813 |

* cited by examiner

FIG. 5

| Component | Time | Element information | | ... | Amount C of correction | Amount D of pickup displacement | True amount E of displacement |
|---|---|---|---|---|---|---|---|
| | | Nozzle group | Feeder group | | | | |
| P001 | YY/MM/DD hh:mm:ss | N001 | F001 | ... | 0.6 | 0.2 | 0.8 |
| P002 | ... | N001 | F002 | ... | 0.4 | -1.6 | -1.2 |
| P003 | ... | N001 | F001 | ... | 0.5 | 0.1 | 0.6 |
| P004 | ... | N002 | F003 | ... | -0.1 | 0.4 | 0.3 |
| P005 | ... | N003 | F003 | ... | -0.5 | -0.2 | -0.7 |
| P006 | ... | N002 | F001 | ... | -0.2 | 0.3 | 0.1 |

41

COMPONENT MOUNTING DEVICE, METHOD, AND SYSTEM THAT CONTROLS HEAD BASED ON DEGREE OF MALFUNCTION

CROSS-REFERENCE OF RELATED APPLICATIONS

This application is the U.S. National Phase under 35 U.S.C. § 371 of International Patent Application No. PCT/JP2019/006867, filed on Feb. 22, 2019, which in turn claims the benefit of Japanese Application No. 2018-033957, filed on Feb. 27, 2018, the entire disclosures of which Applications are incorporated by reference herein.

TECHNICAL HELD

The present disclosure relates to a management device for and a management method of managing a component mounter, and a component mounting system.

BACKGROUND ART

Patent Literature (PTL) 1 discloses a maintenance notification system that notifies whether there is a need for maintenance of a component mounter. The component mounter recognizes images of components picked up by pickup nozzles, corrects pickup displacement based on the results of recognition, and mounts the components onto a substrate. The maintenance notification system according to PTL 1 determines whether there is a need for maintenance of a feeder based on the variations in the results of recognition.

CITATION LIST

Patent Literature

[PTL 1] International Publication No. WO 2016/046967

SUMMARY OF INVENTION

Technical Problem

However, since the results of image recognition fail to properly represent a malfunction of the feeder, the typical maintenance notification system fails to accurately determine whether there is a need for maintenance of the feeder.

To address the problem, the present disclosure provides a management device, a management method, and a component mounting system capable of supporting proper determination on whether there is a need for maintenance for each of constituent elements of a component mounter.

Solution to Problem

In order to achieve the objective, a management device according an aspect of the present disclosure is for managing a component mounter that mounts a plurality of components onto a substrate using some of a plurality of constituent elements each selected from one of a plurality of constituent element groups each including the plurality of constituent elements, one of the plurality of constituent element groups being a nozzle group including a plurality of nozzles. The management device includes: a calculator that calculates, for each of target components which are the plurality of components, a true amount of displacement which is a sum of (i) an amount of pickup displacement which is an amount of displacement between the target component and a target nozzle that is one of the plurality of nozzles and picks up the target component and (ii) an amount of correction which is an amount of offset of a position of the target nozzle when picking up the target component; and a statistical processor that performs parameter estimation for a predetermined statistical model using the true amount of displacement to calculate a first degree of malfunction of each of the plurality of constituent elements.

A component mounting system according an aspect of the present disclosure includes the management device and the component mounter.

A management method according an aspect of the present disclosure is a method of managing a component mounter that mounts a plurality of components onto a substrate using some of a plurality of constituent elements each selected from one of a plurality of constituent element groups each including the plurality of constituent elements, one of the plurality of constituent element groups being a nozzle group including a plurality of nozzles The management method includes: obtaining an amount of pickup displacement being an amount of displacement between a target component being one of the plurality of components and a target nozzle that is one of the plurality of nozzles and picks up the target component; obtaining an amount of correction being an amount of offset of a position of the target nozzle when picking up the target component; calculating a true amount of displacement that is a sum of the amount of pickup displacement and the amount of correction; and performing parameter estimation for a predetermined statistical model using the true amount of displacement to calculate a degree of malfunction of each of the plurality of constituent elements.

An aspect of the present disclosure may be implemented as a program for causing a computer to execute the management method. Alternatively, the aspect may be implemented as a computer-readable storage medium that stores the program.

Advantageous Effects of Invention

The present disclosure supports proper determination on whether there is a need for maintenance for each of constituent elements of a component mounter.

BRIEF DESCRIPTION OF DRAWINGS

FIG. 5 shows example storage information stored in a memory by the management device according to Embodiment 1.

DESCRIPTION OF EMBODIMENTS

Figure 1:
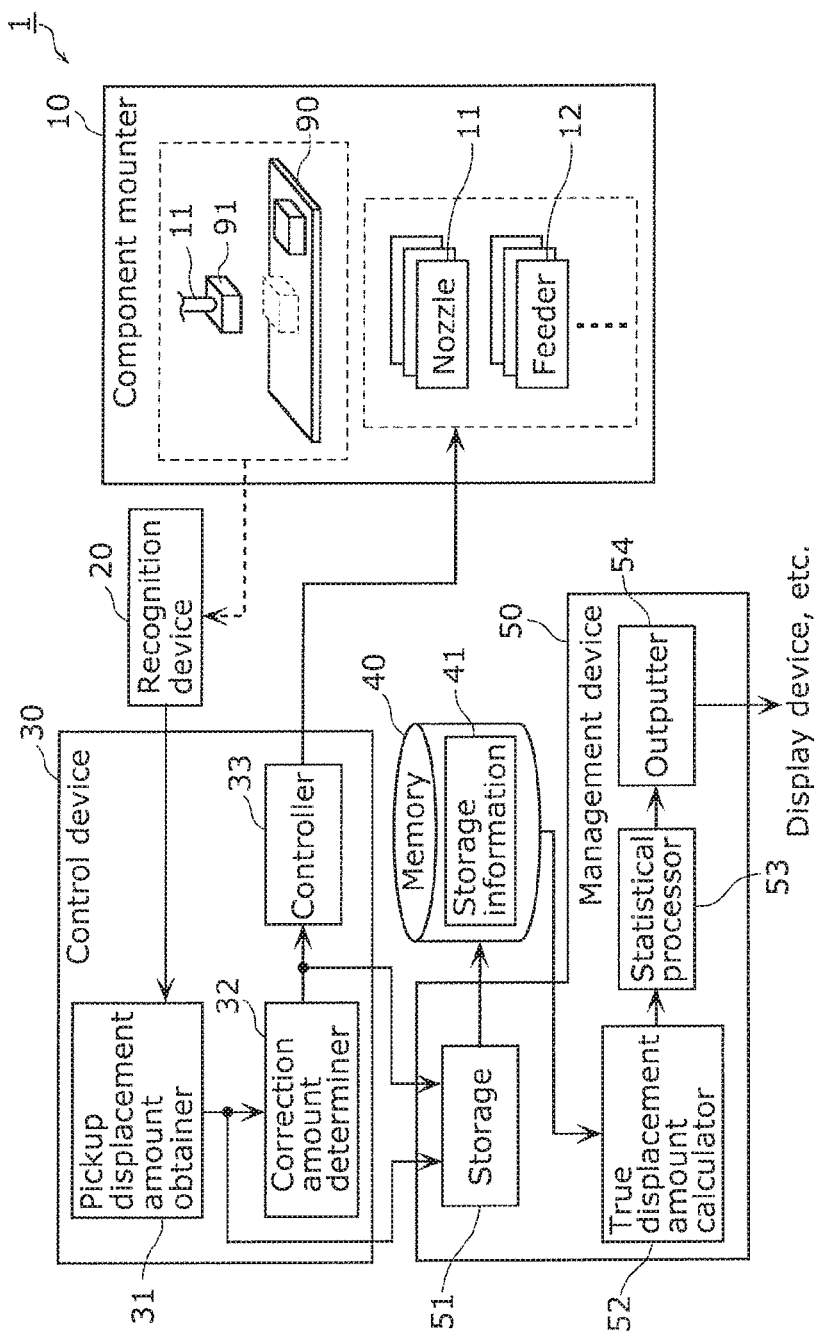
FIG. 1 is a block diagram showing a configuration of a component mounting system including a management device according to Embodiment 1.

[Underlying Knowledge Forming Basis of the Present Disclosure]

The present inventors found that the typical maintenance notification system described in the background art poses the following problem.

The typical maintenance notification system utilizes the results of image recognition, which fail to properly present the malfunction of the feeder. In general, a component mounter corrects the position of a nozzle that picks up a component and then picks up the component. That is, the results of image recognition represent the position deviation caused by the pickup of the nozzle whose position has been corrected.

For this reason, even by utilizing the recognition results, the system fails to determine the original degrees of malfunction of the nozzle and the feeder before the correction. For example, assume that the feeder or the nozzle actually has a malfunction requiring maintenance. Since the position of the nozzle is corrected, the system may determine that there is no malfunction, that is, there is no need for maintenance.

In this manner, the typical maintenance notification system fails to properly determine whether there is a need for maintenance. To address the problem, the present disclosure provides a management device, a management method, and a component mounting system, for example, capable of supporting proper determination on whether there is a need for maintenance for each of constituent elements of a component mounter.

In order to achieve the objective, a management device according to an aspect of the present disclosure is for managing a component mounter that mounts a plurality of components onto a substrate using some of a plurality of constituent elements each selected from one of a plurality of constituent element groups each including the plurality of constituent elements, one of the plurality of constituent element groups being a nozzle group including a plurality of nozzles. The management device includes: a calculator that calculates, for each of target components which are the plurality of components, a true amount of displacement which is a sum of (i) an amount of pickup displacement which is an amount of displacement between the target component and a target nozzle that is one of the plurality of nozzles and picks up the target component and (ii) an amount of correction which is an amount of offset of a position of the target nozzle when picking up the target component; and a statistical processor that performs parameter estimation for a predetermined statistical model using the true amount of displacement to calculate a first degree of malfunction of each of the plurality of constituent elements.

In this configuration, the true amount of displacement that is the sum of the amount of pickup displacement and the amount of correction is used to calculate the first degree of malfunction for each constituent element. Thus, the calculated first degree of malfunction properly represents the degree of malfunction of each constituent element. Since the first degree of malfunction is a proper value, it is properly determined utilizing the first degree of malfunction whether there is a need for maintenance for each constituent element.

In this manner, the management device according to this aspect supports the proper determination on whether there is a need for maintenance for each of the constituent elements of the component mounter.

In general, erroneous pickup occurs due to a large displacement caused by each constituent element. In the present disclosure, the displacement caused by each constituent element is visible as the first degree of malfunction. This hinders errors before the occurrence of the erroneous pickup of the component and allows preventive maintenance for each constituent element with a higher degree of malfunction. Accordingly, delays or losses in manufacturing due to the erroneous pickup of the components can be reduced.

The management device according to this aspect utilizes the calculated first degree of malfunction to perform maintenance, when the first degree of malfunction increases. This reduces the times for maintenance as compared to periodic maintenance.

Even in the periodic maintenance, a large degradation of a nozzle, for example, with time may cause erroneous pickup before the next maintenance. By contrast, the management device according to this aspect utilizes the calculated first degree of malfunction to perform maintenance, when degradation with time and the degree of malfunction increase. This reduces the possibility of actual erroneous pickup of the components. Since it is properly determined whether there is a need for maintenance, decreases in the productivity and quality of products can be reduced.

At the movement of the target nozzle that has picked up the target component, displacement of the target component according to the movement of the target nozzle, that is, movement displacement may occur. For example, if the target component is heavy or there is large acceleration and deceleration, the movement displacement tends to occur. In this case, when the recognition device recognizes deviation of the pickup position, the deviation of the pickup position includes not only the pickup displacement caused when the target nozzle has picked up the target component but also the movement displacement.

To address the problem, for example, in the management device according to the aspect of the present disclosure, the amount of pickup displacement may include an amount of displacement caused by a movement after the target nozzle has picked up the target component.

This configuration increases the accuracy in analyzing the cause(s) for the displacement and thus increases the accuracy of the first degree of malfunction. Since the accuracy in determining whether there is a need for maintenance increases, decreases in the productivity and quality of products can be reduced.

For example, the parameter estimation for the statistical model may be maximum likelihood estimation, maximum a posteriori probability estimation, or Bayesian estimation.

In this configuration, the processing is performed based on the maximum likelihood estimation, the maximum a posteriori probability estimation, or the Bayesian estimation to increase the accuracy of the first degree of malfunction. That is, the calculated first degree of malfunction more properly represents the degree of malfunction of each constituent element. The management device according to this aspect supports highly accurate determination on whether there is a need for maintenance for each of the constituent elements of the component mounter.

For example, the management device according to the aspect of the present disclosure may further include: an outputter that outputs, when the first degree of malfunction exceeds the first threshold, information indicating one of the plurality of constituent elements associated with the first degree of malfunction that has exceeded a first threshold determined in advance.

With this configuration, the constituent element indicated by the output information can be specified as a constituent element to be maintained. The specification of the constituent element to be maintained reduces the time required for the maintenance. Accordingly, for example, the component mounter has a long operation time.

For example, another one of the plurality of constituent element groups may be a feeder group including the plurality of feeders. The management device may further include an obtainer that obtains an amount of displacement of at least one of feeding mechanisms of a plurality of feeders, when the first degree of malfunction exceeds a threshold determined in advance. The statistical processor may further perform statistical processing using the amount of displacement obtained by the obtainer to calculate a second degree of malfunction. The management device may further comprise an outputter that outputs a maintenance instruction, when the second degree of malfunction exceeds a second threshold determined in advance.

With this configuration, the comparison between the first degree of malfunction and the first threshold, and the comparison between the second degree of malfunction and the second threshold are performed at the two stages. This allows accurate determination on whether there is a need for maintenance. In addition, the comparison between the second degree of malfunction and the second threshold is not performed, when the first degree of malfunction is lower than or equal to the first threshold. Accordingly, assume that the first degree of malfunction is lower than or equal to the first threshold and the component mounter is less likely to have a malfunction. In this case, there is no need to perform the processing of obtaining the amount of displacement of the feeding mechanism of the feeder required for calculating the second degree of malfunction. In this manner, the processing related to the determination on whether there is a need for maintenance can be omitted to reduce a decrease in the productivity of the component mounter. On the other hand, assume that the first degree of malfunction exceeds the first threshold and the component mounter is more likely to have a malfunction. In this case, the comparison between the second degree of malfunction and the second threshold is performed to accurately detect the malfunction of the component mounter.

For example, the component mounter may include: a head that holds the plurality of nozzles; a head control device that controls a movement of the head; and an imaging device attached to the head. The outputter may further output a predetermined signal to the head control device, when the first degree of malfunction exceeds the first threshold. Upon receipt of the predetermined signal, the head control device may move the head to cause the imaging device to perform imaging to generate an image containing the at least one of feeding mechanisms. The obtainer may obtain the amount of displacement of the at least one of feeding mechanisms based on the image generated by the imaging device.

This configuration provides the amount of displacement of the feeding mechanism required for calculating the second degree of malfunction utilizing the imaging device attached to the head. The imaging device attached to the head is generally provided for calibrating the pickup positions of the components. Since no imaging device dedicated to obtaining the amount of displacement of the feeding mechanism to reduce a complication of the configuration of the component mounter and an increase in the costs. While the imaging device attached to the head images the feeding mechanism, no component is mountable. Accordingly, only when the first degree of malfunction exceeds the first threshold, the imaging device captures the feeding mechanism to reduce the period in which no component is mountable and a decrease in the productivity.

For example, the management device according to the aspect of the present disclosure may further include: a storage that stores, in a memory, element information indicating a combination of the plurality of constituent elements used for mounting the target component and including the target nozzle, the amount of pickup displacement, and the amount of correction in association with each other for each of the target components.

In this configuration, the information used for calculating the true amount of displacement and the degree of malfunction is stored in the memory. Thus, the true amount of displacement and the degree of malfunction can be calculated at any time. For example, upon confirmation of an increase in the degree of malfunction, the frequency of calculating the degree of malfunction is increased to increase the number of determinations on whether there is a need for maintenance. Accordingly, maintenance can be performed before the occurrence of erroneous pickup of the components.

A component mounting system according to an aspect of the present disclosure includes the management device and the component mounter.

With this configuration, the component mounting system properly determines whether there is a need for maintenance for each of the constituent elements of the component mounter, utilizing the degree of malfunction calculated by the management device.

A management method according to an aspect of the present disclosure is a method of managing a component mounter that mounts a plurality of components onto a substrate using some of a plurality of constituent elements each selected from one of a plurality of constituent element groups each including the plurality of constituent elements, one of the plurality of constituent element groups being a nozzle group including a plurality of nozzles The management method includes: obtaining an amount of pickup displacement being an amount of displacement between a target component being one of the plurality of components and a target nozzle that is one of the plurality of nozzles and picks up the target component; obtaining an amount of correction being an amount of offset of a position of the target nozzle when picking up the target component; calculating a true amount of displacement that is a sum of the amount of pickup displacement and the amount of correction; and performing parameter estimation for a predetermined statistical model using the true amount of displacement to calculate a degree of malfunction of each of the plurality of constituent elements.

With this feature, the management method supports proper determination on whether there is a need for maintenance for each of the constituent elements of the component mounter like the management device described above.

A storage medium according to an aspect of the present disclosure is a non-transitory computer-readable storage medium storing a program for causing a computer to execute the management method.

With this configuration, the program supports proper determination on whether there is a need for maintenance for each of the constituent elements of the component mounter like the management device described above.

Now, embodiments will be described in detail with reference to the drawings.

Note that the embodiments described below are mere comprehensive or specific examples of the present disclosure. The numerical values, shapes, materials, constituent elements, the arrangement and connection of the constituent elements, steps, step orders etc. shown in the following embodiments are thus mere examples, and are not intended to limit the scope of the present disclosure. Among the constituent elements in the following embodiments, those not recited in any of the independent claims are described as optional constituent elements.

The figures are schematic representations and not necessarily drawn strictly to scale. The scales are thus not necessarily the same in the figures. In the figures, substantially the same constituent elements are assigned with the same reference marks, and redundant descriptions will be omitted or simplified.

Embodiment 1

First, a configuration of a component mounting system including a management device according to Embodiment 1 will be described with reference to FIG. 1. FIG. 1 is a block diagram showing a configuration of component mounting system 1 including management device 50 according to this embodiment.

As shown in FIG. 1, component mounting system 1 includes component mounter 10, recognition devices 20, control device 30, memory 40, and management device 50. Note that FIG. 1 schematically shows that component mounter 10 mounts, onto substrate 90, target component 91 that is one of a plurality of components to be mounted onto substrate 90.

Component mounter 10 includes a plurality of constituent element groups each of which includes a plurality of constituent elements. Component mounter 10 mounts a plurality of components on the substrate using the constituent elements each of which is selected from one of the constituent element groups.

Specifically, the constituent element groups include a nozzle group and a feeder group. The nozzle group includes a plurality of nozzles 11 each of which picks up the components. The feeder group includes a plurality of feeders 12 each of which feeds the components. In component mounter 10, target component 91, which is a component fed by one of feeders 12 selected from the feeder group, is picked up by one of nozzles 11 selected from the nozzle group. Picked-up target component 91 is mounted onto substrate 90. Note that the constituent element groups may include a head group, a reel group, and a component type group. The head group includes a plurality of heads each of which holds one of nozzles 11. The reel group includes a plurality of reels each of which is to be wrapped with a carrier tape housing a plurality of components. The component type group includes a plurality of component types such as shapes. That is, in this embodiment, the constituent element group may include not only constituent members, such as nozzles, constituting component mounter 10 but also components to be mounted by component mounter 10. Specifically, the components to be mounted are divided into component types depending on the shapes. Each of the component types is one of the constituent elements of component mounter 10.

Figure 2:
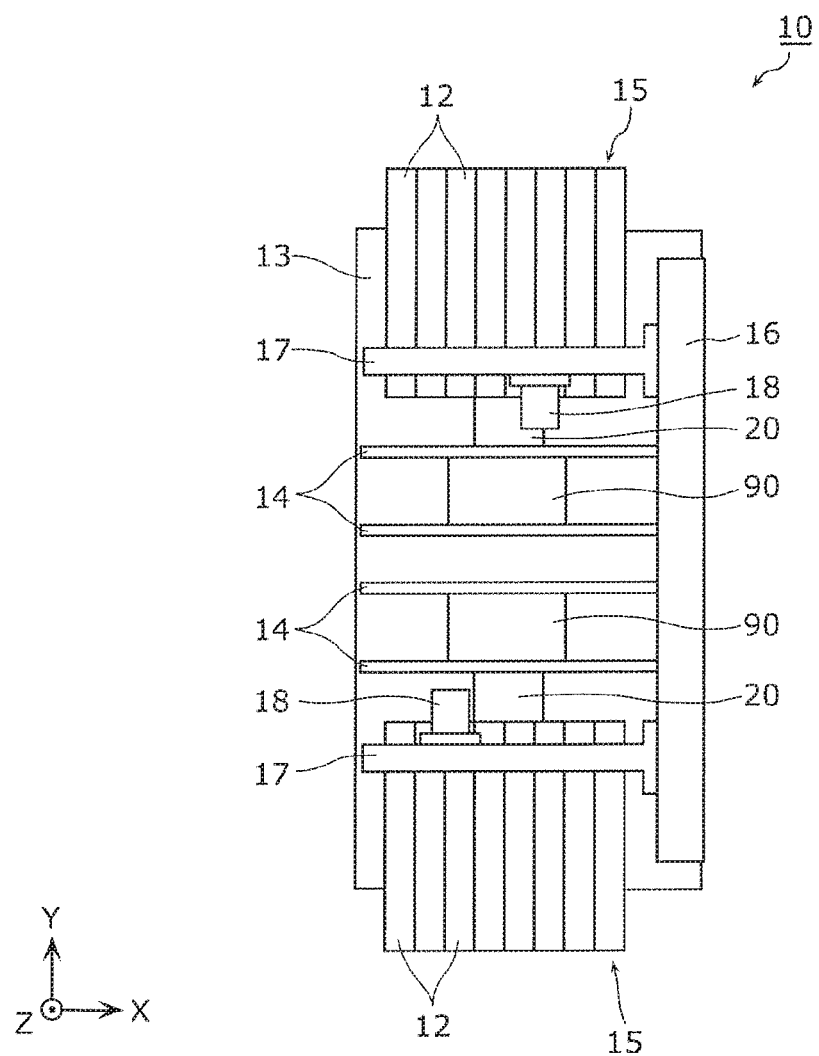
FIG. 2 is a plan view of a component mounter included in the component mounting system according to Embodiment 1.
Figure 3:
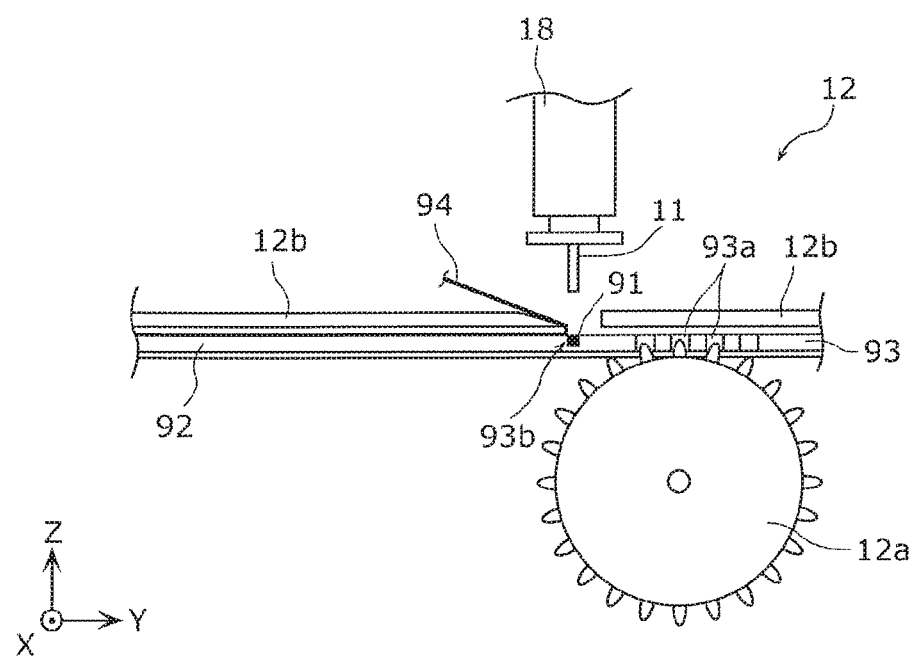
FIG. 3 is a side view showing an example configuration of a feeder of the component mounter included in the component mounting system according to Embodiment 1.

FIG. 2 is a plan view of component mounter 10 included in component mounting system 1 according to this embodiment. FIG. 3 is a side view showing an example configuration of feeder 12 of component mounter 10 included in component mounting system 1 according to this embodiment. The X-, Y-, and Z-axes shown in FIGS. 2 and 3 correspond to three axes of the three-dimensional orthogonal coordinate system. The X- and Y-axes are two axes orthogonal to each other on a plane parallel to substrates 90. The X-axis is parallel to the direction in which substrates 90 is transferred, whereas the Y-axis is parallel to the feed direction of carrier tape 92. The Z-axis is orthogonal to the plane.

As shown in FIG. 2, component mounter 10 includes two substrate transfer mechanisms 14 at the center of base 13. Each substrate transfer mechanism 14 transfers associated one of substrates 90 along the X-axis and positions the substrate into an operation position in the component mount. At one end of each substrate transfer mechanism 14, component feeder 15 including the plurality of feeders 12 is located. Each of feeders 12 performs pitch feeding of carrier tape 92 to feed a component to a component dispensing slot.

As shown in FIG. 3, feeder 12 includes sprocket 12a and pressing member 12b. Sprocket 12a is connected to a motor (not shown) and rotates in accordance with the rotation of the motor.

As shown in FIG. 3, carrier tape 92 includes base tape 93 and cover tape 94. Base tape 93 has feeding holes 93a into which the teeth of sprocket 12a (i.e., sprocket pins) are inserted. The rotation of sprocket 12a is transmitted to feeding holes 93a so that carrier tape 92 moves in the positive direction of the Y-axis.

Base tape 93 has a plurality of recesses 93b each of which houses one of the components. Recesses 93b are covered by cover tape 94, which is peeled by pressing member 12b near the component dispensing slot to expose recesses 93b. This configuration allows each nozzle 11 to pick up target component 91 housed in one of exposed recesses 93b.

As shown in FIG. 2, table 16 moving along the Y-axis and including a linear driving mechanism at one end of base 13 along the X-axis. Table 16 moving along the Y-axis is coupled to two tables 17 moving along the X-axis, each of which includes a linear driving mechanism. Each of tables 17 moving along the X-axis is attached with head 18 holding one of nozzles 11. Head 18 is movable along the X-axis by the linear driving mechanism of the associated one of tables 17 moving along the X-axis. Two tables 17 moving along the X-axis are movable along the Y-axis by the linear driving mechanism of table 16 moving along the Y-axis. Accordingly, nozzles 11 held by heads 18 are movable within the XY-plane.

With a movement of each head 18, associated nozzle 11 picks up target component 91 housed in recess 93b of carrier tape 92, moves to the mount position on substrate 90, and place picked-up target component 91 onto substrate 90. Note that each head 18 may be attached with a plurality of nozzles 11 and a plurality of components may be mounted by one movement.

In this manner, in order to mount a single component, the plurality of constituent elements including feeder 12 and nozzle 11 are used in cooperation with each other. Specifically, at least one of the constituent elements is selected from each of the plurality of constituent element groups included in component mounter 10. A single component is mounted using the selected constituent elements.

In this embodiment, component mounter 10 is controlled by control device 30 and managed by management device 50.

Each recognition device 20 recognizes the positional relationship between target component 91 and nozzle (target nozzle) 11 that picks up target component 91. Target component 91 is to be picked up by nozzle 11.

Specifically, each recognition device 20 is a camera that captures the area for pickup processing of target component 91 such as the component dispensing slot or the area through which nozzle 11 that has picked up target component 91 passes. Recognition device 20 captures target component 91 and nozzle 11 while picking up target component 91 to generate an image. For example, as shown in FIG. 2, each recognition device 20 is interposed between the associated pair of substrate transfer mechanism 14 and component feeder 15.

Recognition device 20 and control device 30 are connected wired or wireless to send and receive information. Each recognition device 20 outputs, to control device 30, the image generated by capturing.

Control device 30 controls an operation of component mounter 10. As shown in FIG. 1, control device 30 includes pickup displacement amount obtainer 31, correction amount determiner 32, and controller 33.

Figure 4:
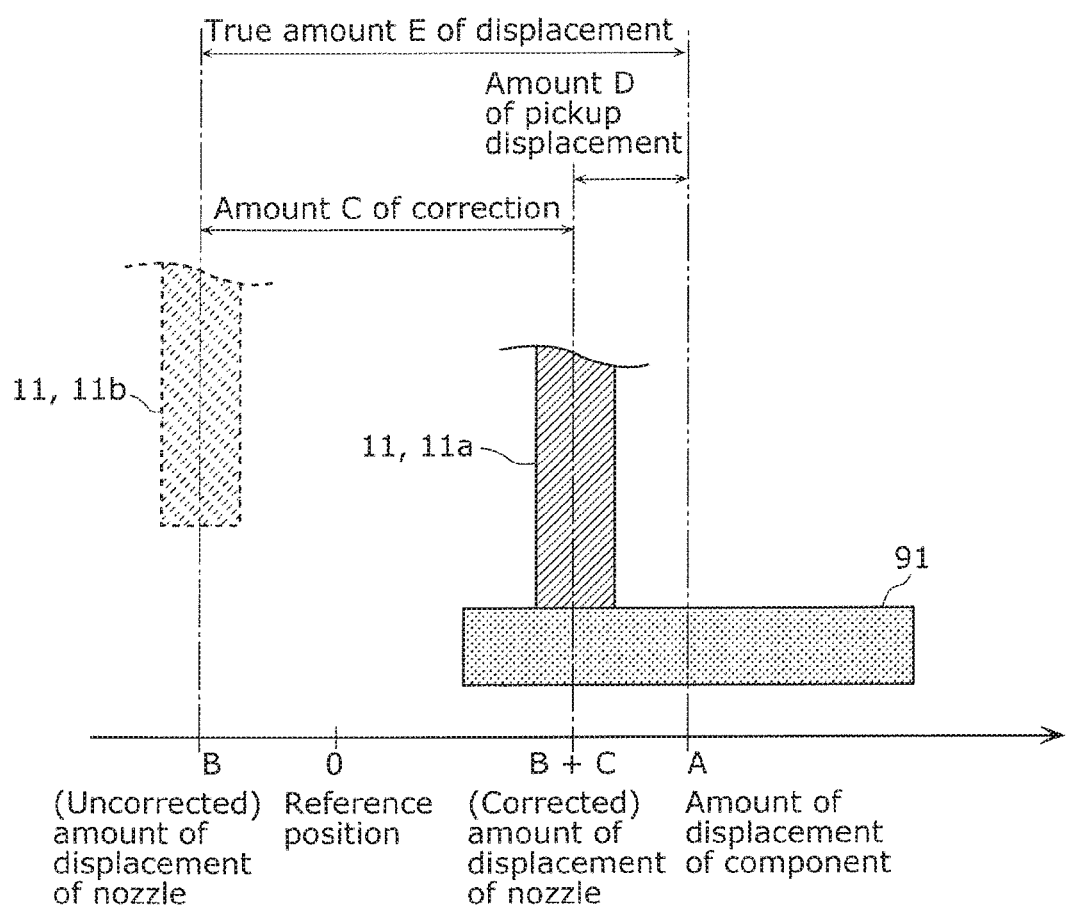
FIG. 4 is a side view showing that one of nozzles included in the component mounter of the component mounting system according to Embodiment 1 picks up a component.

Pickup displacement amount obtainer 31 obtains an amount of pickup displacement. The amount of pickup displacement corresponds to amount D of pickup displacement shown in FIG. 4, that is, the amount of the displacement between target component 91 to be picked up and nozzle 11 that picks up target component 91. Note that FIG. 4 is a side view showing that one of nozzles 11 included in component mounter 10 of component mounting system 1 according to this embodiment picks up target component 91. Amount D of pickup displacement, amount C of correction, and true amount E of displacement will be described later in detail.

Specifically, pickup displacement amount obtainer 31 obtains the image output from each recognition device 20 and performs image processing such as edge extraction processing to identify nozzle 11 and target component 91 in the image. Pickup displacement amount obtainer 31 calculates the amount of the displacement between nozzle 11 and target component 91 (i.e., amount D of pickup displacement) from the positional relationship between identified nozzle 11 and target component 91 to obtain amount D of pickup displacement.

Amount D of pickup displacement obtained by pickup displacement amount obtainer 31 is output to correction amount determiner 32 and storage 51 of management device 50. Note that the image processing and the calculation of amount D of pickup displacement may be performed by recognition devices 20. In this case, recognition device 20 outputs information indicating calculated amount D of pickup displacement to control device 30. Pickup displacement amount obtainer 31 obtains the information output from recognition device 20 to obtain amount D of pickup displacement.

Correction amount determiner 32 determines an amount of correction based on amount D of pickup displacement. The amount of correction corresponds to amount C of correction shown in FIG. 4, that is, the amount of offset of nozzle 11, which picks up target component 91, at the time of picking up target component 91. Nozzle 11 picks up the component in the position shifted by amount C of correction determined by correction amount determiner 32.

Correction amount determiner 32 determines amount C of correction to reduce amount D of pickup displacement, for example. Amount C of correction determined by correction amount determiner 32 is output to controller 33 and storage 51 of management device 50. Determined amount C of correction is utilized in picking up the next component.

Note that amount C of correction may be ideally determined so that amount D of pickup displacement is 0. However, for example, if a plurality of nozzles 11 are fixed to single head 18, the nozzles 11 move integrally. Amount C of correction cannot be thus determined so that pickup displacement amounts D of all nozzles 11 are 0. In this case, correction amount determiner 32 may determine single amount C of correction for nozzles 11 so that the mean or variance of pickup displacement amounts D is approximated to 0, for example.

Controller 33 controls operations of the constituent elements included in component mounter 10. Specifically, controller 33 selects at least one constituent element to be used for mounting target component 91 from each of the constituent element groups, and controls the selected constituent elements. For example, controller 33 controls each of feeder 12 that feeds target component 91 and nozzle 11 that picks up target component 91. At this time, controller 33 shifts the pickup position of nozzle 11 by amount C of correction determined by correction amount determiner 32 and causes the nozzle to pick up target component 91.

In this manner, control device 30 functions to feed back the mounting processing by component mounter 10. That is, the control device determines amount C of correction based on amount D of pickup displacement that is the amount of the displacement between target component 91 and the actual pickup position of nozzle 11, that is, the corrected pickup position of nozzle 11. At the time of picking up the next component, the control device shifts the pickup position by determined amount C of correction and causes nozzle 11 to pick up the component. For example, the determiner determines amount C of correction to reduce amount D of pickup displacement, thereby improving the accuracy in picking up the components.

Control device 30 may include, for example, a non-volatile memory storing programs, a volatile memory that is a temporary storage area for executing the programs, input/output ports, a processor that executes the programs. Pickup displacement amount obtainer 31, correction amount determiner 32, and controller 33 may be implemented as software executed by a processor, or hardware such as electronic circuits including a plurality of circuit elements.

Memory 40 is an example storage device for storing storage information 41, Memory 40 is a non-volatile memory such as a hard disk drive (HDD) or a flash memory.

FIG. 5 shows example storage information 41 stored in memory 40 by management device 50 according to this embodiment. Storage information 41 contains mount log information by component mounter 10. Specifically, as shown in FIG. 5, the mount log information includes the times when the components are mounted, element information indicating combinations of the constituent elements utilized for mounting, amount C of correction, and amount D of pickup displacement of each of the mounted components.

The times are those when nozzles 11 have picked up the components, for example, but may be those when the picked-up components have been placed on substrates 90. Alternatively, the times are those when the components have been captured by recognition devices 20. The times are represented by dates in year/month/day format and times in hour/minute/second format. Note that the times may be represented by a unit, such as millisecond, smaller than second.

Specifically, the element information indicates the constituent elements each of which is selected from one of the constituent element groups. In this embodiment, unique identification information is assigned to each constituent element. The element information indicates thus identification information assigned to the constituent elements each of which is selected from one of the constituent element groups.

For example, as shown in FIG. 5, each of nozzles 11 included in the nozzle group is assigned with identification information represented by "N" and a three-digit number. Each of feeders 12 included in the feeder group is assigned with identification information represented by "F" and a three-digit number. Note that the identification information may be in any type as long as the constituent elements can be identified.

Amount C of correction is determined by correction amount determiner 32 of control device 30.

Amount D of pickup displacement is obtained by pickup displacement amount obtainer 31 of control device 30.

Storage information 41 includes true amount E of displacement. True amount E of displacement is a value calculated by management device 50 and represented by the sum of amount C of correction and amount D of pickup displacement.

The example in FIG. 5 shows that component P001 has been mounted using nozzle 11 with identification number "N001" and feeder 12 with identification number "F001", for example. Amount C of correction of nozzle 11 when picking up component P001 was "0.6", amount D of pickup displacement was "0.2". Being the sum of amount C of correction and amount D of pickup displacement, true amount E of displacement was "0.8".

Management device 50 manages component mounter 10. Specifically, management device 50 calculates the degree of malfunction of each of the constituent elements included in component mounter 10. The management device outputs information available for the determination on whether there is a need for maintenance for each constituent element based on the calculated degree of malfunction.

In this embodiment, as shown in FIG. 1, management device 50 includes storage 51, true displacement amount calculator 52, statistical processor 53, and outputter 54.

Storage 51 stores, in memory 40, the element information, amount D of pickup displacement, and amount C of correction in association with each target component. In this embodiment, storage 51 further stores true amount E of displacement in association with each target component. Storage 51 stores the various information in memory 40, thereby generating storage information 41.

True displacement amount calculator 52 calculates, for each target component, true amount E of displacement that is the sum of amount D of pickup displacement and amount C of correction. Specifically, true displacement amount calculator 52 reads storage information 41 stored in memory 40. The calculator calculates, for each target component, the sum of amount C of correction and amount D of pickup displacement included in read storage information 41. Accordingly, true amount E of displacement associated with the target component is calculated. Calculated true amount E of displacement is stored in memory 40 in association with the target component.

Statistical processor 53 performs arithmetic processing of a predetermined statistical model using true amount E of displacement, for performing predetermined parameter estimation to calculate the degree of malfunction of each constituent element. The arithmetic processing for the predetermined parameter estimation is, for example, maximum likelihood estimation, maximum a posteriori probability estimation, or Bayesian estimation. Details will be described later.

The degree of malfunction of each constituent element is an example first degree of malfunction, that is, the degree of malfunction estimated for the constituent element. For example, the degree of malfunction is represented by the estimated amount of displacement of the associated constituent element. Alternatively, the degree of malfunction may be represented by the mean and standard deviation of the displacement of the associated constituent element. The "displacement" corresponds to the displacement from a normal state and corresponds to true amount E of displacement of nozzle 11, for example.

When the degree of malfunction exceeds a threshold determined in advance, outputter 54 outputs, as a maintenance instruction, the information indicating the constituent element associated with the degree of malfunction that has exceeded the threshold. Specifically, outputter 54 compares the degree of malfunction of each constituent element calculated by statistical processor 53 to the threshold to determine whether the degree of malfunction exceeds the threshold.

The threshold is an example of the first threshold, for example, different from constituent element group to constituent element group. At this time, if the degree of malfunction includes positive and negative values, the threshold may include two thresholds of a positive threshold and a negative threshold. For example, the thresholds used for the nozzle group are "−2.0" and "2.0", whereas the thresholds used for the feeder group are "−1.2" and "2.0". Note that a common threshold may be shared by all the constituent element groups.

Outputter 54 generates and outputs, for example, a notification image as the maintenance instruction. The notification image is for notifying a manufacturing manager or a maintenance operator, for example, of a constituent element to be maintained. The notification image indicates, for example, the constituent element associated with the degree of malfunction determined as having exceeded the threshold, that is the constituent element with a malfunction. For example, the notification image includes a text representing the identification information on the constituent element with the malfunction. The notification image is output to a display device, for example, and displayed by the display device. Note that the display device is connected to management device 50 wired or wireless and displays the image output from management device 50.

Note that outputter 54 may generate no notification image but audio information indicating a constituent element with a malfunction. Outputter 54 may output the audio information to an audio outputter such as a speaker so that the speaker converts the audio information into sound and outputs the sound. Note that management device 50 may include the display device or the speaker, for example. The output form is not particularly limited and may be printing onto a printed matter such as paper.

The output information may indicate only a constituent element with a malfunction or may be a list of all the constituent elements in association with presence/absence of a malfunction. In place of the presence/absence of a malfunction, whether there is a need for maintenance may be associated.

Management device 50 may include, for example, a non-volatile memory storing programs, a volatile memory that is a temporary storage area for executing the programs, input/output ports, a processor that executes the programs. Storage 51, true displacement amount calculator 52, statistical processor 53, and outputter 54 may be implemented as software executed by a processor, or hardware such as electronic circuits including a plurality of circuit elements.

Now, the details of amount C of correction, amount D of pickup displacement, and true amount E of displacement will be described with reference to FIG. 4.

In the reference position shown in FIG. 4 is, for example, pickup is performed properly, when all the constituent element such as target component 91 and nozzle 11 are under normal conditions. In the example shown in FIG. 4, target component 91 is displaced from the reference position in the positive direction of a one-way arrow at distance |A|, which is the absolute value of A. The uncorrected position of nozzle 11b to perform pickup is displaced from the reference position toward the opposite side of the one-way arrow at distance 131. Note that distance B is a negative value.

FIG. 4 shows two nozzles 11a and 11b. Nozzle 11a corresponds to nozzle 11 whose pickup position has been corrected. That is, nozzle 11a corresponds to nozzle 11 that actually picks up target component 91. Nozzle 11b corresponds to nozzle 11 whose pickup position has not been corrected. That is, the amount of the positional shift between nozzle 11b and nozzle 11a corresponds to amount C of correction.

In this embodiment, the bold one-way arrow of FIG. 4 defines the positive and negative values of amount C of correction, amount D of pickup displacement, and true amount E of displacement. Note that the positions of nozzle 11 are represented by the lines (i.e., the one-dot chain lines in FIG. 4) each of which passes through the center of associated nozzle 11. On the other hand, the position of target component 91 is represented by the line (i.e., the two-dot chain line in FIG. 4) passing through the center of target component 91.

For example, the absolute value of amount C of correction is defined as the distance offset from the nozzle position with reference to uncorrected nozzle 1ib. The positive and negative signs of amount C of correction represent the directions in which the positions are corrected. For example, as shown in FIG. 4, if uncorrected nozzle 11b moves in the direction agreeing with the one-way arrow, amount C of correction has a positive value. On the other hand, if nozzle 11b moves opposite to the one-way arrow, amount C of correction is a negative value.

The absolute value of amount D of pickup displacement is defined as the distance to the correct pickup position of target component 91 with reference to corrected nozzle 11a. Note that the correct pickup position of target component 91 is, for example, at the center of target component 91 and represented by the two-dot chain line in FIG. 4. The positive and negative signs of amount D of pickup displacement represent the directions of the correct pickup position of target component 91 with respect to nozzle 11a.

For example, as shown in FIG. 4, if the direction from corrected nozzle 11a toward the center of target component 91 agrees with the one-way arrow, amount D of pickup displacement is a positive value. On the other hand, if the direction from nozzle 11a toward the center of target component 91 is opposite to the one-way arrow, amount D of pickup displacement is a negative value.

True amount E of displacement is the sum of amount C of correction and amount D of pickup displacement. That is, true amount E of displacement represents the amount of displacement between the pickup position of nozzle 11b whose pickup position is uncorrected and the correct position of picking up target component 91, that is, the center position of target component 91.

The positive and negative signs of true amount E of displacement are defined with reference to uncorrected nozzle 1ib. True amount E of displacement being a positive value means that target component 91 is positioned on the positive side of nozzle 11b in the one-way arrow. On the other hand, true amount E of displacement being a negative value means that target component 91 is positioned on the negative side of nozzle 11b in the one-way arrow.

Note that the definition of the positive and negative values of amount C of correction, amount D of pickup displacement, and true amount E of displacement is a mere example. For example, the positive and negative values may be defined in opposite directions. In addition, while amount C of correction, amount D of pickup displacement, and true amount E of displacement are represented by the single direction (i.e., one dimension), the amounts may be defined two-dimensionally on the XY-plane. In this case, the amounts may be subjected to arithmetic processing separately along the X- and Y-axes or may be processed by vector arithmetic.

Figure 6:
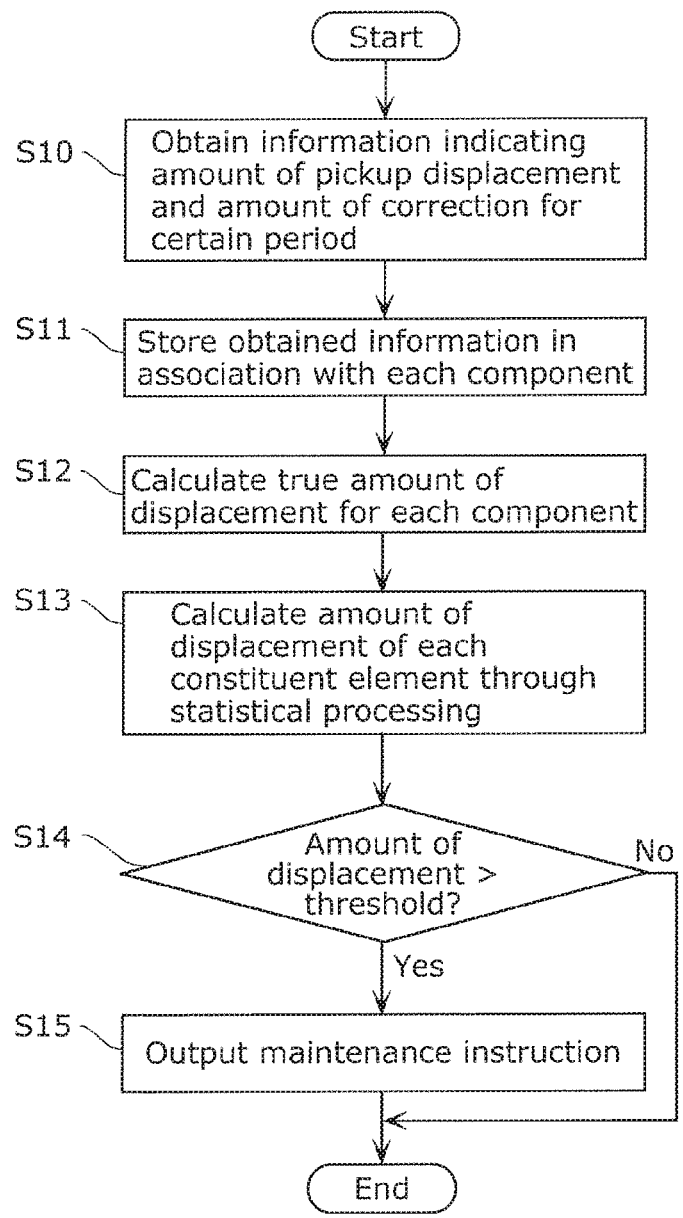
FIG. 6 is a flowchart showing an example operation of the management device according to Embodiment 1.

Now, an operation of management device 50 according to this embodiment will be described with reference to FIG. 6. FIG. 6 is a flowchart showing the operation of management device 50 according to this embodiment.

As shown in FIG. 6, first, in management device 50, storage 51 obtains information indicating amount D of pickup displacement and amount C of correction for a certain period (S10). Storage 51 obtains amount D of pickup displacement and amount C of correction for each pickup processing, that is, for each target component 91. Storage 51 further obtains, for each target component 91, element information indicating constituent elements utilized for picking up the target component.

The certain period is a predetermined period such as one day or one hour, or a predetermined processing unit such as a mounting period based on a substrate lot. Note that storage 51 may obtain, for each pickup processing of target component 91, the information on amount D of pickup displacement and amount C of correction or may collectively obtain the information for the certain period.

Storage 51 stores, as storage information 41, the obtained information in memory 40 in association with each processing (S11). "Each processing" is each pickup processing of single target component 91, for example. Thus, for example, as shown in FIG. 5, amount D of pickup displacement and amount C of correction are associated with the identification information on each target component 91. In addition, the element information is associated with the identification information on each target component 91. The element information may be information on a constituent element such as a feeder or a nozzle, or a setting element, such as the speed of a head, influencing the amount of displacement.

Next, true displacement amount calculator 52 calculates true amount E of displacement for each target component 91 based on storage information 41 (S12). Specifically, true displacement amount calculator 52 reads amount D of pickup displacement and amount C of correction included in storage information 41 from memory 40. The calculator calculates the sum of read amount D of pickup displacement and read amount C of correction for each target component 91 to calculate true amount E of displacement when picking up target component 91. True displacement amount calculator 52 stores calculated true amount E of displacement in storage information 41 via storage 51.

After that, statistical processor 53 performs arithmetic processing for performing the parameter estimation for the predetermined statistical model using true amount E of displacement to calculate the degree of malfunction as the amount of displacement of each constituent element (S13).

Now, a specific example of arithmetic processing by statistical processor 53 will be described.

For example, statistical processor 53 performs the maximum likelihood estimation of the parameters of the statistical model. Specifically, as indicated by expression (1), statistical processor 53 performs the maximum likelihood estimation on the assumption that true amount $True_{zure}$ of displacement calculated for each component depends on normal distribution N.

$$True_{zure} \sim N(feeder[n]+nozzle[n]+\ldots,\sigma) \quad (1)$$

In expression (1), "~" means that random variable $True_{zure}$ depends on probability distribution N. Probability distribution N ($\mu$, $\sigma$) means the normal distribution with a mean of $\mu$ and a standard deviation of $\sigma$. The probability distribution is not limited to the normal distribution but may be the Student's t-distribution, the Cauchy distribution, or the Laplace distribution.

The mean of normal distribution N represents the sum of degrees of malfunction of all the constituent elements included in the constituent element groups included in component mounter 10. Specifically, "feeder [n]" in expression (1) means the degree of malfunction of the n-th feeder included in the feeder group. Similarly, "nozzle [n]" means the degree of malfunction of the n-th feeder included in the feeder group. Statistical processor 53 performs the maximum likelihood estimation to obtain the degree of malfunction in expression (1).

Note that all the constituent elements are included in the data to be subjected to statistical processing and utilized for mounting the components. That is, the constituent elements that have never been used for mounting the components may be excluded. Specifically, statistical processor 53 performs the statistical processing based on expression (1) using, as targets, the constituent elements indicated by the element information contained in storage information 41 shown in FIG. 5.

Alternatively, statistical processor 53 may perform the maximum a posteriori probability estimation. Specifically, like in the maximum likelihood estimation, statistical processor 53 maximizes the a posteriori probability (MAP estimation) based on expression (1) on the assumption that true amount $True_{zure}$ of displacement calculated for each component depends on normal distribution N.

At this time, the prior distribution of each constituent element is normal distribution N (0, $\sigma$) as a common prior distribution. Note that standard deviation a of the prior distribution is assumed to be a constant. Statistical processor 53 maximizes the a posteriori probability based on expression (1) and using the normal distribution N (0, $\sigma$) as the prior distribution of each constituent element. The processor calculates the estimated amount of displacement of each constituent element as the degree of malfunction. Alternatively, the Laplace distribution may be used as the prior distribution.

Next, outputter 54 compares the estimated amount of displacement calculated for each constituent element, that is, the degree of malfunction to the threshold (S14). If at least one estimated amount of displacement is larger than the threshold (Yes in S14), outputter 54 outputs the maintenance instruction (S15). The maintenance instruction is the information for identifying the constituent element associated with the degree of malfunction that has exceeded the threshold, for example.

If all the estimated amounts of displacement are smaller than the threshold (No in S14), the management processing by management device 50 ends. Note that if all the estimated amounts of displacement are smaller than the threshold, outputter may output the information notifying the manufacturing manager or the maintenance operator, for example, that there is no need for maintenance.

Note that the management method shown in FIG. 6 is performed by management device 50, for example, each time when the mount processing for a certain period has completed. For example, management device 50 performs the management method every day or every hour. Alternatively, management device 50 may change the timing or frequency of executing the management method based on the calculated degrees of malfunction. For example, the degrees of malfunction do not exceed the threshold but approximate the threshold, the frequency of executing the management method may be increased.

Alternatively, for example, the device may obtain the degrees of malfunction in a certain period immediately after the maintenance under normal conditions and fit the normal distribution to these degrees of malfunction. If a new degree of malfunction is obtained, the event probability of the degree of malfunction may be calculated. In this case, the threshold is set to the event probability of the degree of malfunction.

As described above, management device 50 according to this embodiment performs the arithmetic processing for performing the parameter estimation for the predetermined statistical model using true amount E of displacement to calculate, as the degree of malfunction, the estimated amount of displacement of each constituent element.

In this manner, true amount E of displacement that is the sum of amount D of pickup displacement and amount C of correction is used. Accordingly, the calculated estimated amount of displacement properly represents the degree of malfunction of each constituent element. Since the estimated amount of displacement is a proper value, it is properly determined utilizing the estimated amount of displacement whether there is a need for maintenance for each constituent element.

As described above, management device 50 according to this embodiment supports proper determination on whether there is a need for maintenance for each of the constituent elements included in component mounter 10.

[Variation]

Now, an operation according to another example of statistical processing will be described.

Figure 7:
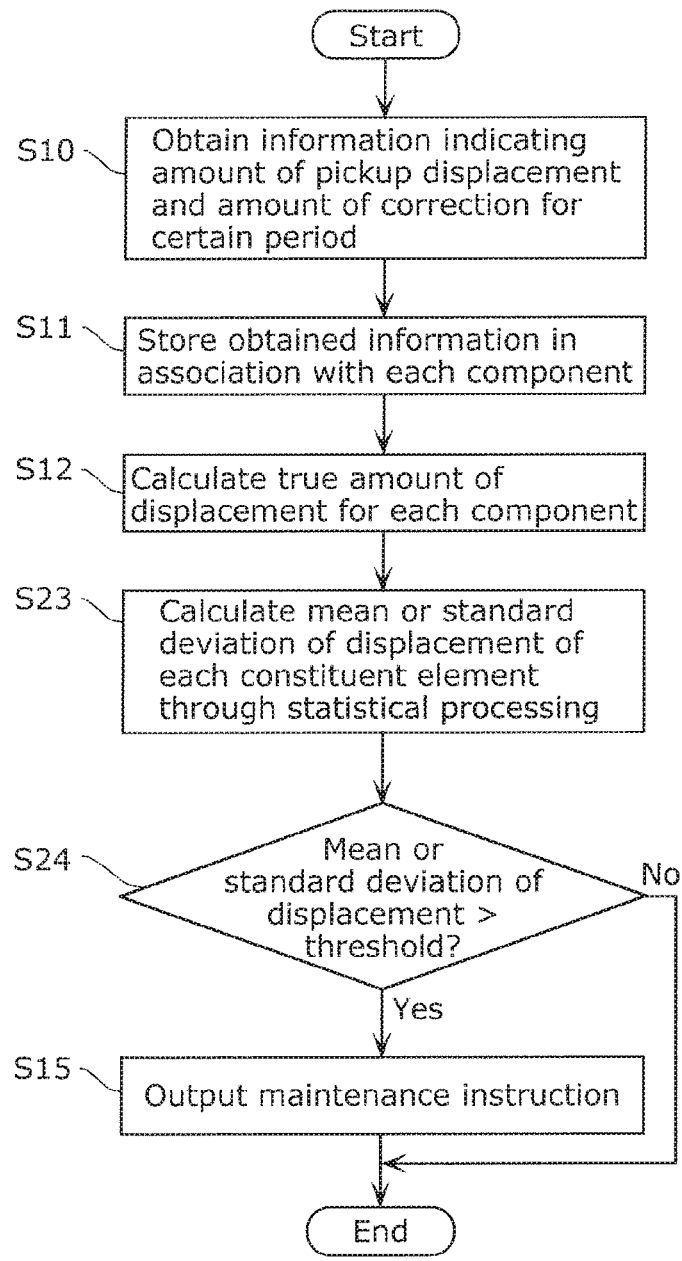
FIG. 7 is a flowchart showing another example operation of the management device according to Embodiment 1.

FIG. 7 is a flowchart showing another example operation of management device 50 according to this embodiment.

As shown in FIG. 7, the processing until the calculation of true amount E of displacement (i.e., S10 to S12) are the same as that in the flowchart shown in FIG. 6. The explanation of the points common to the flowchart shown in FIG. 6 will be omitted and the differences will be mainly described below.

Next, statistical processor 53 performs arithmetic processing based on the predetermined statistical model using true amount E of displacement to calculate, as the degree of malfunction, the mean and standard deviation of the displacement of the constituent elements (S23).

In this variation, statistical processor 53 performs the arithmetic processing based the Bayesian estimation as the a posteriori probability maximization model. The statistical model for estimating the parameters through the Bayesian estimation may be, for example, as follows.

For example, as indicated by expression (2), a different standard deviation is assumed for each constituent element group.

$$\text{True}_{zure} \sim N(\text{feeder}[n]+\text{nozzle}[n]+\ldots,\sigma)$$

$$\text{Feeder}[n]N(0,\text{feeder}\_\sigma),\text{feeder}\_\sigma \sim N^+(0,\text{hyper}\_a)$$

$$\text{Nozzle}[n] \sim N(0,\text{nozzle}\_\sigma),\text{nozzle}\_\sigma \sim N^+(0,\text{hyper}\_b) \quad (2)$$

In expression (2), feeder [n] represents the variable corresponding to the degree of malfunction of the n-th feeder included in the feeder group in accordance with the normal distribution with a mean of 0 and a standard deviation of feeder_$\sigma$. Nozzle [n] represents the variable corresponding to the degree of malfunction of the n-th nozzle included in the nozzle group in accordance with the normal distribution with a mean of 0 and a standard deviation of nozzle_$\sigma$. Note that the values may be assumed to be in accordance with the Student's t-distribution, the Cauchy distribution, or the Laplace distribution instead of the normal distribution.

In expression (2), feeder_$\sigma$ and nozzle_$\sigma$ may be constants. In addition, as indicated by expression (2), the prior distributions may be set to feeder_$\sigma$ and nozzle_$\sigma$ to perform the Bayesian hierarchical modeling. $N^+$ represents the half normal distribution. Specifically, feeder_$\sigma$ is in accordance with the half normal distribution with a mean of 0 and a standard deviation of hyper_a. Nozzle_$\sigma$ is in accordance with the half normal distribution with a mean of 0 and a standard deviation of hyper_b. Hyper_a and hyper_b are constants. Note that the values may be assumed to be in accordance with a weakly-informative prior such as the half t-distribution, the exponential distribution, or the gamma distribution instead of the half normal distribution. Note that a similar probability distribution is assumed for the constituent element groups other than the feeder and nozzle groups.

For example, as indicated by expression (3), assumed means and standard deviations may be different from constituent element group to constituent element group.

$$\text{True}_{zure} \sim N(\text{feeder}[n]+\text{nozzle}[n]+\ldots,\sigma)$$

$$\text{feeder}[n] \sim N(\text{feeder\_mean}\_n,\text{feeder}\_\sigma\_n)$$

$$\text{feeder\_mean}\_n \sim N(0,\text{hyper}\_a1)$$

$$\text{feeder}\_\sigma\_n \sim N^+(0,\text{hyper}\_b1)$$

$$\text{nozzle}[n] \sim N(\text{nozzle\_mean}\_n,\text{nozzle}\_\sigma\_n)$$

$$\text{nozzle\_mean}\_n \sim N(0,\text{hyper}\_a2)$$

$$\text{nozzle}\_\sigma\_n \sim N^+(0,\text{hyper}\_b2) \quad (3)$$

In expression (3), feeder [n] is a random variable according to the normal distribution with a mean of feeder_mean_n and a standard deviation of feeder_$\sigma$_n and corresponds to the degree of malfunction of the n-th feeder included in the feeder group. Feeder_mean_n and feeder_$\sigma$_n may be constants. In addition, as indicated by expression (3), the prior distributions are set to feeder_mean_n and feeder_$\sigma$_n to perform the Bayesian hierarchical modeling. Feeder_mean_n is in accordance with the normal distribution with a mean of 0 and a standard deviation of hyper_a1. Feeder_$\sigma$_n is the standard displacement of the n-th feeder in accordance with the half normal distribution with a mean of 0 and a standard deviation of hyper_b1.

Similarly, nozzle [n] is a random variable according to the normal distribution with a mean of nozzle_mean_n and a standard deviation of nozzle_$\sigma$_n, and corresponds to the degree of malfunction of the n-th nozzle included in the nozzle group. Nozzle_mean_n and nozzle_$\sigma$_n may be constants. In addition, as indicated by expression (3), the prior distributions are set to nozzle_mean_n and nozzle_$\sigma$_n to perform the Bayesian hierarchical modeling. Nozzle_mean_n is a mean of the n-th feeder in accordance with the normal distribution with a mean of 0 and a standard deviation of hyper_a2. Nozzle_$\sigma$_n is in accordance with the half normal distribution with a mean of 0 and a standard deviation of hyper_b2.

The values may be here assumed to be in accordance with a weakly-informative prior such as the Student's t-distribution, the Cauchy distribution, or the Laplace distribution instead of the normal distribution. In addition, the values may be assumed to be in accordance with a weakly-informative prior such as the half t-distribution, the exponential distribution, or the gamma distribution instead of the half normal distribution. A similar probability distribution is assumed for the constituent element groups other than the feeder and nozzle groups.

For example, the probability distributions according to the characteristics of the constituent element groups may be assumed. For example, as shown in FIG. 3, feeder 12 causes sprocket 12*a* to turn by a predetermined angle to move carrier tape 92 pitch by pitch, thereby feeding target components 91 one by one. Thus, in accordance with the turning period of sprocket 12*a*, target components 91 fed into periodic positions. For example, every a components are fed by single feeder 12 into similar positions. Value $\alpha$ is a natural number and corresponds to the number of components fed in a single rotation of sprocket 12*a*.

In this case, for example, as indicated by expression (4), the mean and the standard deviation may be assumed for each feeder.

$$\text{True}_{zure} \sim N(\text{feeder}[n][k]+\text{nozzle}[n]+\ldots,\sigma)$$

$$\text{feeder}[n][k] \sim N(\text{feeder\_mean}\_n,\text{feeder}\_\sigma\_n)$$

$$\text{feeder\_mean}\_n \sim N(0,\text{hyper}\_a1)$$

$$\text{feeder}\_\sigma[n] \sim N^+(0,\text{hyper}\_b1)$$

$$\text{nozzle}[n] \sim N(\text{nozzle\_mean}\_[n],\text{nozzle}\_\sigma\_[n])$$

$$\text{nozzle\_mean}\_[n] \sim N(0,\text{hyper}\_a2)$$

$$\text{nozzle}\_\sigma\_[n] \sim N^+(0,\text{hyper}\_b2) \quad (4)$$

As indicated by expression (4), feeder [n][k] represents the random variables, which correspond to the degree of malfunction, of $\alpha \times n$-th feeder included in the feeder group. Feeder [n][k] is in accordance with the normal distribution with a mean of feeder_mean [n] and a standard deviation of feeder_$\sigma$ [n].

Feeder_mean [n] represents the mean of the n-th feeder included in the feeder group in accordance with the normal distribution with a mean of 0 and a standard deviation of hyper_a1. Feeder_$\sigma$ [n] represents the standard displacement of the n-th feeder included in the feeder group in accordance with the half normal distribution with a mean of 0 and a standard deviation of hyper_b1.

Similarly, nozzle [n] represents the random variable, which corresponds to the degree of malfunction, of the n-th nozzle included in the nozzle group in accordance with the normal distribution with a mean of nozzle_mean [n] and a standard deviation of nozzle_σ[n]. Nozzle_mean [n] is the mean of the n-th nozzle in accordance with the normal distribution with a mean of 0 and a standard deviation of hyper_a2. Nozzle_σ[n] is the standard displacement of the n-th nozzle in accordance with the half normal distribution with a mean of 0 and a standard deviation of hyper_b2.

The probability distribution may be assumed based on the one state of feeder 12 before the feeding operation, for example. Feeder 12 feeds target components 91 one by one through each turn of sprocket 12a at a predetermined angle, that is, each feeding operation. It is thus highly possible that the one state before the feeding operation influences the feeding operation of present target component 91.

In this case, for example, as indicated by expression (5), the standard deviation may be assumed for each feeder.

$$\text{True}_{zure} \sim N(\text{feeder}[n][t] + \text{nozzle}[n] + \ldots, \sigma)$$

$$\text{feeder}[n][t] \sim N(\text{feedern}[t-1], \text{feeder}\_\sigma\_n)$$

$$\text{feeder}\_\sigma\_[n] \sim N^+(0, \text{hyper}\_b1)$$

$$\text{nozzle}[n] \sim N(0, \text{nozzle}\_\sigma)$$

$$\text{nozzle}\_\sigma \sim N^+(0, \text{hyper}\_b2) \quad (5)$$

As indicated by expression (5), feeder [n][t] represents a random variable, which corresponds to the degree of malfunction, of the t-th feeding operation of the n-th feeder included in the feeder group. Feeder [n][t] is in accordance with the normal distribution with a mean of feeder [n][t−1] and a standard deviation of feeder_σ [n]. Feeder_σ [n] represents the standard displacement of the n-th feeder included in the feeder group in accordance with the half normal distribution with a mean of 0 and a standard deviation of hyper_b1. Hyper_b1 may be a constant. In addition, a prior distribution may be set to hyper_b1 to perform the Bayesian hierarchical modeling. Hyper_b1 may be assumed to be in accordance with a weakly-informative prior such as the half t-distribution, the exponential distribution, or the gamma distribution.

Similarly, nozzle [n] represents a random variable, which corresponds to the degree of malfunction, of the n-th nozzle included in the nozzle group in accordance with the normal distribution with a mean of 0 and a standard deviation of nozzle_σ[n]. Nozzle_σ[n] represents the standard displacement of the n-th nozzle in accordance with the half normal distribution with a mean of 0 and a standard deviation of hyper_b2. Hyper_b2 may be a constant. In addition, a prior distribution may be set to hyper_b2 to perform the Bayesian hierarchical modeling. Hyper_b2 may be assumed to be in accordance with a weakly-informative prior such as the half t-distribution, the exponential distribution, or the gamma distribution.

For example, the probability distribution may be assumed based on the one state of feeder 12 before the feeding operation and the amount of displacement occurring at each feeder.

$$\text{True}_{zure} \sim N(\text{feeder}[n][t] + \text{nozzle}[n] + \ldots, \sigma)$$

$$\text{feeder}[n][t] \sim N(\text{feeder}[n][t-1] + \text{feeder}\_\text{mean}[n], \sigma2)$$

$$\text{feeder}\_\text{mean}[n] \sim N(0, \text{hyper}\_a1)$$

$$\text{nozzle}[n] \sim N(0, \text{nozzle}\_\sigma)$$

$$\text{nozzle}\_\sigma \sim N^+(0, \text{hyper}\_b2) \quad (6)$$

Feeder_mean [n] represents the mean of the displacement of the n-th feeder included in the feeder group in accordance with the normal distribution with a mean of 0 and a standard deviation of hyper_a1. Hyper_a1 may be a constant. In addition, a prior distribution may be set to hyper_a1 to perform the Bayesian hierarchical modeling. The values may be assumed to be in accordance with a weakly-informative prior such as the half t-distribution, the exponential distribution, or the gamma distribution.

Statistical processor 53 performs the Bayesian estimation on the assumption given by any of expressions (2) to (6) to calculate the a posteriori probability distribution of the variable corresponding to the degree of malfunction of each constituent element. For example, the mean and standard deviation of the a posteriori probability distribution of feeder [n] correspond to the mean and standard deviation of the displacement of the n-th feeder. Similarly, the mean and standard deviation of the a posteriori probability distribution of nozzle [n] correspond to the mean and standard deviation of the displacement of the n-th nozzle.

Next, outputter 54 compares the mean and standard deviation calculated for each constituent element to a threshold (S24). If at least one of the mean or the standard deviation is greater than the threshold (Yes in S24), outputter 54 outputs the maintenance instruction (S15). The maintenance instruction is, for example, the information specifying the constituent element associated with the degree of malfunction that has exceeded the threshold.

If all the means and standard deviations are smaller than the threshold (No in S24), the management processing by management device 50 ends. Note that all the means and standard deviations are smaller than the threshold, outputter 54 may output the information notifying the manufacturing manager or the maintenance operator, for example, that there is no need for maintenance.

As described above, management device 50 according to this variation performs processing based on the predetermined statistical model using true amount E of displacement to calculate, as the degree of malfunction, the mean and standard deviation of the displacement of each constituent element.

In this manner, true amount E of displacement that is the sum of amount D of pickup displacement and amount C of correction is used as in Embodiment 1. Accordingly, the mean and standard deviation of the calculated displacement properly represents the degree of malfunction of the constituent element. Since the mean and standard deviation of the displacement are proper values, it is properly determined utilizing the estimated amount of displacement whether there is a need for maintenance for each constituent element.

As described above, management device 50 according to this variation supports proper determination on whether there is a need for maintenance for each constituent element included in component mounter 10.

Embodiment 2

Now, Embodiment 2 will be described.

An example has been described in Embodiment 1 where the maintenance instruction is output, when the first degree of malfunction calculated based on the result of recognition by recognition device 20 exceeds the first threshold. On the other hand, in Embodiment 2, if the first degree of malfunction exceeds a first threshold, another means is used to calculate a second degree of malfunction. The calculated second degree of malfunction is compared to a second threshold. When the second degree of malfunction exceeds the second threshold, the maintenance instruction is output. In this manner, in Embodiment 2, the degrees of malfunction and the thresholds are compared at two stages to output the maintenance instruction. The differences from Embodiment 1 will be mainly described below and description of the common points will be omitted or simplified.

Figure 8:
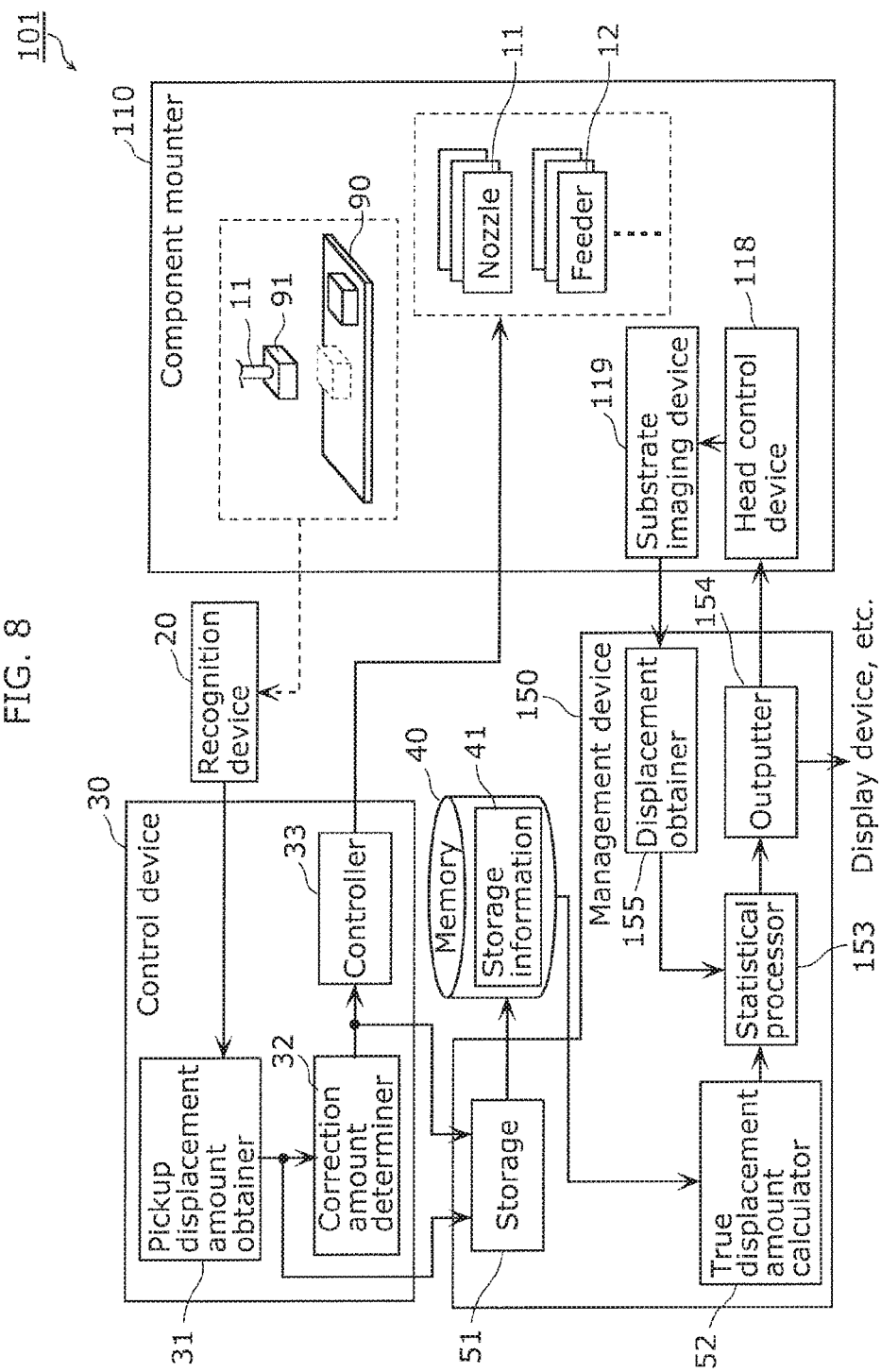
FIG. 8 is a block diagram showing a configuration of a component mounting system including a management device according to Embodiment 2.

FIG. 8 is a block diagram showing a configuration of component mounting system 101 including management device 150 according to this embodiment. As shown in FIG. 8, component mounting system 101 includes component mounter 110 and management device 150 in place of component mounter 10 and management device 50 unlike component mounting system 1 according to Embodiment 1.

As shown in FIG. 8, component mounter 110 includes a plurality of nozzles 11, a plurality of feeders 12, head control devices 118, and substrate imaging device 119. Although not shown in FIG. 8, component mounter 110 includes table 16 moving along the Y-axis, tables 17 moving along the X-axis, and heads 18, for example, like component mounter 10 shown in FIGS. 2 and 3.

Each head control device 118 controls the movement of associated one of heads 18. Specifically, each head control device 118 controls the linear driving mechanisms of table 16 moving along the Y-axis and associated one of tables 17 moving along the X-axis so as to move associated head 18. Each head control device 118 moves associated head 18 between associated feeders 12 and substrate 90 as processing related to the mount of target components 91. This causes respective nozzles 11 held by heads 18 to pick up target components 91 from feeders 12 to place the components in the mount positions on substrate 90.

In this embodiment, each head control device 118 performs processing different from the processing related to the mount of target components 91 upon receipt of a predetermined signal from outputter 154 of management device 150. Specifically, upon receipt of the predetermined signal, each head control device 118 moves associated head 18 to cause substrate imaging device 119 to perform imaging to generate an image containing the feeding mechanism of feeder 12.

Substrate imaging device 119 is an example imaging device attached to each head 18. Substrate imaging device 119 is for calibrating the pickup position, if there is an erroneous component pickup. Specifically, substrate imaging device 119 images the pickup position of each target component 91 within the range including recesses 93b of carrier tape 92 shown in FIG. 3.

Substrate imaging device 119 is movable with a movement of associated one of heads 18 to change the imaging range. For example, substrate imaging device 119 moves together with head 18 to image the area including the teeth of sprocket 12a inserted in feeding holes 93a of base tape 93. The teeth of sprocket 12a are an example feeding mechanism of feeder 12. Substrate imaging device 119 generates the image containing the teeth of sprocket 12a and outputs the generated image to displacement obtainer 155 of management device 150.

In the moving range of head 18 in the processing related to the mount of target components 91, the imaging range of substrate imaging device 119 includes no feeding mechanism of feeder 12. Accordingly, upon receipt of the predetermined signal, each head control device 118 moves associated head 18 to the position out of the moving range of head 18 at the time of mounting the target component, specifically, to the position in which the teeth of sprocket 12a fall within the imaging range. Thus, upon receipt of the predetermined signal, no target component 91 is mountable. Conversely, with a decrease in the number of imaging of the teeth of sprocket 12a, a decrease in the productivity can be reduced. In this embodiment, outputter 154 of management device 150 outputs a smaller number of predetermined signals to reduce a decrease in the productivity.

As shown in FIG. 8, management device 150 newly includes displacement obtainer 155 and includes statistical processor 153 and outputter 154 in place of statistical processor 53 and outputter 54, unlike management device 50 according to Embodiment 1.

Displacement obtainer 155 obtains the amount of displacement of at least one feeding mechanism of the plurality of feeders 12. Specifically, displacement obtainer 155 obtains the amount of displacement of the feeding mechanism based on the image generated by substrate imaging device 119 and containing the feeding mechanism. For example, displacement obtainer 155 obtains the image generated by substrate imaging device 119 and performs image processing such as edge extraction processing of the obtained image to obtain the amount of displacement of the feeding mechanism. The amount of displacement of the feeding mechanism can be calculated from the head, for example, ideally from the position where the teeth of sprocket 12a are present. Displacement obtainer 155 may store the obtained amount of displacement in memory 40. For example, as indicated by storage information 41 of FIG. 5, displacement obtainer 155 may store, in memory 40, imaging times, element information indicating feeders 12 to be imaged, and the amount of displacement in association with each other.

In addition to the processing performed by statistical processor 53 according to Embodiment 1, statistical processor 153 performs statistical processing using the amount of displacement obtained by displacement obtainer 155 to calculate the second degree of malfunction. For example, statistical processor 153 calculates, as the second degree of malfunction, at least one of the mean and standard deviation and the mean and standard deviation of a change in the amounts of displacement obtained by displacement obtainer 155.

When the first degree of malfunction exceeds the first threshold, outputter 154 outputs the predetermined signal to each head control device 118. That is, while the first degree of malfunction is lower than or equal to the first threshold, the predetermined signal is not output and thus associated head 18 does not image the teeth of sprocket 12a. As a result, a decrease in the productivity can be reduced.

Unlike in Embodiment 1, outputter 154 according to this embodiment outputs no maintenance instruction only when the first degree of malfunction exceeds the first threshold. Outputter 154 outputs the maintenance instruction when the first degree of malfunction exceeds the first threshold and the second degree of malfunction exceeds the second threshold. For example, when the teeth of sprocket 12 with a large amount of displacement is imaged by substrate imaging device 119, it is determined that the second degree of malfunction exceeds the second threshold.

The second threshold is at least one of the mean and standard deviation and the mean and standard deviation of a change calculated in advance based on the amount of displacement of sprocket 12a under the normal conditions, for example. When the mean of amount of displacement (i.e., the second degree of malfunction) calculated by statistical processor 153 is larger than the mean (i.e., the second threshold) calculated in advance, outputter 154 outputs the maintenance instruction. In this case, outputter 154 outputs, as the maintenance instruction, the information indicating that feeder 12 including this sprocket 12a has a malfunction and is to be maintained.

Figure 9:
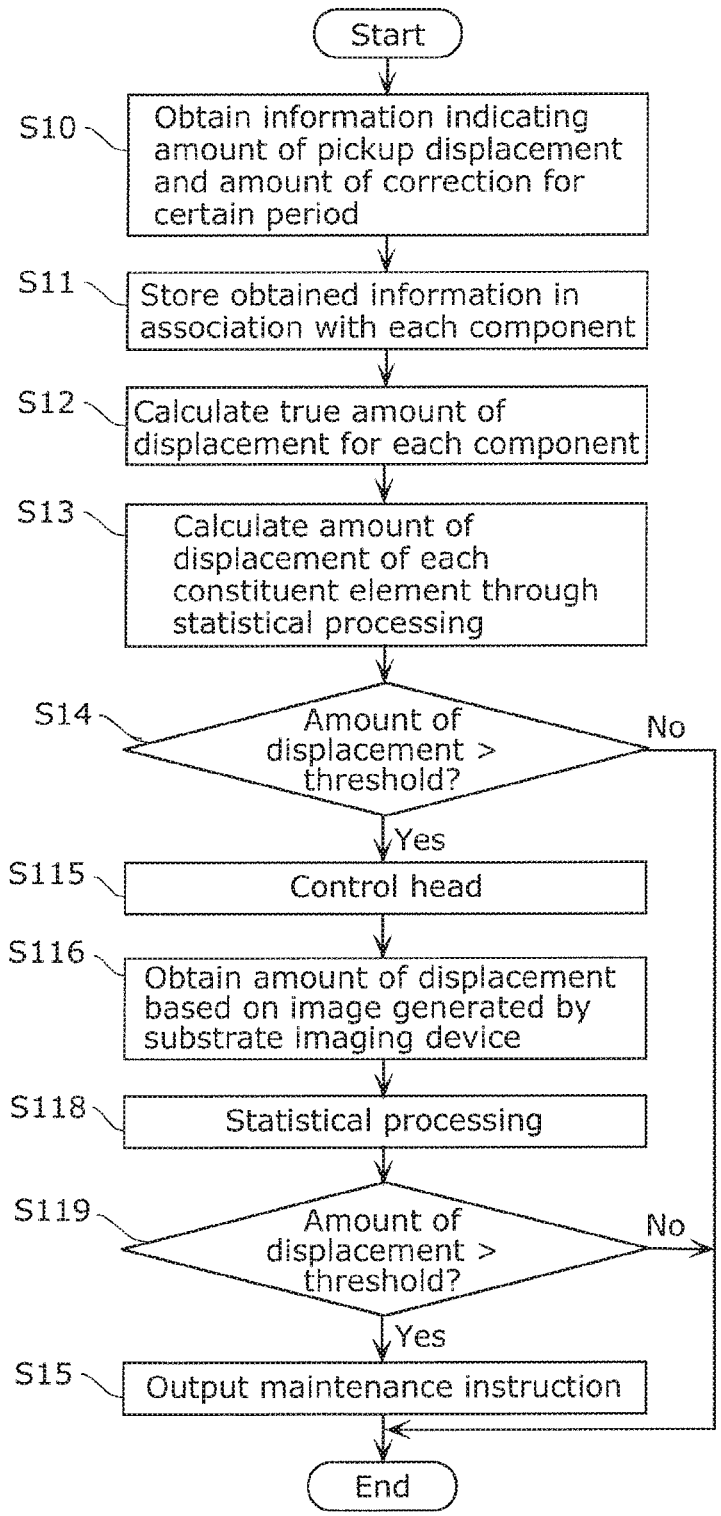
FIG. 9 is a flowchart showing an example operation of the component mounting system according to Embodiment 2.

Now, an operation of management device 150 according to this embodiment will be described with reference to FIG. 9. FIG. 9 is a flowchart showing an operation of management device 150 according to this embodiment.

As shown in FIG. 9, the processing from S10 to S14 are the same as in Embodiment 1. Namely, in S10, the information indicating amount D of pickup displacement and amount C of correction is obtained for a certain period. In S14, the estimated amount of displacement calculated for each constituent element, that is, the first degree of malfunction is compared to the first threshold. If all the estimated amounts of displacement are smaller than the first threshold (No in S14), the management processing by management device 50 ends as in Embodiment 1.

If the estimated amounts of displacement, that is, the first degrees of malfunction are higher than the first threshold (Yes in S14), associated one of heads 18 moves (S115). Specifically, first, outputter 154 outputs the predetermined signal to head control devices 118. Each head control device 118 moves head 18 to cause substrate imaging device 119 to image the feeding mechanism of feeder 12. Substrate imaging device 119 outputs, to displacement obtainer 155, the image obtained by imaging and containing the feeding mechanism (specifically, the teeth of sprocket 12a).

Next, displacement obtainer 155 obtains the amounts of displacement based on the image generated by substrate imaging device 119 (S116). Displacement obtainer 155 causes memory 40 to store the obtained amounts of displacement.

After that, statistical processor 153 performs statistical processing based on the amounts of displacement obtained by displacement obtainer 155 (S118). For example, statistical processor 153 calculates, as the second degree of malfunction, at least one of the mean and standard deviation and the mean and standard deviation of a change in the amounts of displacement obtained by displacement obtainer 155.

Then, outputter 154 compares the second degree of malfunction calculated by statistical processor 153, that is, the amount of displacement subjected to the statistical processing to the second threshold (S119). If the second degree of malfunction exceeds the second threshold (Yes in S119), outputter 154 outputs the maintenance instruction (S15). If the amount of displacement subjected to the statistical processing is smaller than the second threshold (No in S119), the management processing by management device 50 ends.

As described above, component mounting system 101 according to this embodiment performs the two-stage determination processing (see steps S14 and S119) before outputting the maintenance instruction. At this time, the first degree of malfunction used for the determination at the first stage, specifically, the amount of displacement calculated in step S13 is obtained not by directly checking a malfunction of feeder 12 but by a result of calculation through the statistical processing. The following case may thus occur. Although the first degree of malfunction of feeder 12 is higher than the first threshold, feeder 12 actually has no malfunction. That is, the degree of malfunction may be erroneously estimated by the statistical processing.

In this embodiment, when the first degree of malfunction exceeds the first threshold, substrate imaging device 119 is utilized to image the feeding mechanism of feeder 12 and calculates the second degree of malfunction based on the obtained image. This provides a more accurate degree of malfunction of feeder 12 and thus improves the determination on whether there is a need for maintenance. Since unnecessary maintenance can be reduced, a decrease in the operating rate of component mounter 110 is reduced, which lead to reduction in a decrease in the productivity.

Embodiment 3

Now, Embodiment 3 will be described.

An example has been described in Embodiment 1 where no deviation of the pickup position in accordance with the movement of head 18 after nozzle 11 has picked up target component 91 is taken into consideration. For example, if target component 91 is small or light or head 18 moves with a smaller acceleration and deceleration, the processing according to Embodiment 1 is useful. On the other hand, in Embodiment 3, the true amount of displacement is calculated with the deviation of the pickup position in accordance with the movement of head 18 after nozzle 11 has picked up target component 91 taken into consideration. The differences from Embodiment 1 will be mainly described below and description of the common points will be omitted or simplified. The management device according to Embodiment 3 and the operation of the device are the same or similar to those in Embodiment 1 and thus will be described utilizing the configuration of component mounting system 1 shown in FIG. 1.

Figure 10:
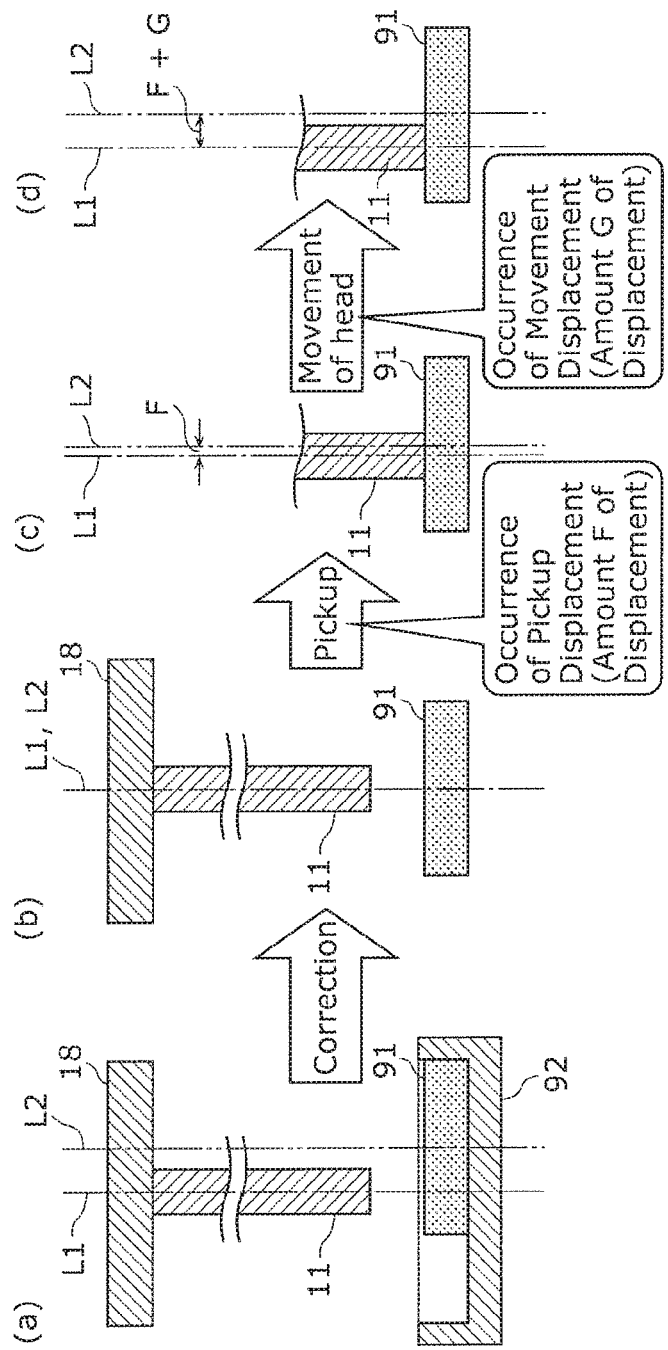
FIG. 10 is a pickup operation of a component by one of nozzles included in a component mounter of a component mounting system according to Embodiment 3.

FIG. 10 shows an operation of a nozzle included in a component mounter of a component mounting system according to this embodiment and picking up a component. In FIG. 10, the one-dot chain line represents center position L1 of nozzle 11, whereas the two-dot chain line represents center position L2 of target component 91.

In FIG. 10, (a) shows a state of nozzle 11 before correction. Nozzle 11 picks up target component 91 held by carrier tape 92 fed by feeder 12 (not shown). At this time, at least one of the positions of nozzle 11, feeder 12, and target component 91 in carrier tape 92 is deviated. This causes displacement between center position L1 of nozzle 11 represented by the one-dot chain line and center position L2 of target component 91 represented by the two-dot chain line.

As shown in (b) of FIG. 10, the position of nozzle 11 is ideally corrected so that center position L1 of nozzle 11 agrees with center position L2 of target component 91. However, as shown in (c) of FIG. 10, at the time of actual pickup, there is pickup displacement with an amount of displacement F between center position L1 of nozzle 11 and center position L2 of target component 91.

Next, as shown in (d) of FIG. 10, head 18 moves to cause movement displacement with amount G of displacement. Specifically, a rapid increase in the acceleration and deceleration immediately after the start of the movement of head 18 causes movement displacement. If head 18 includes a plurality of nozzles 11 to pick up a plurality of target component 91, acceleration and deceleration of head 18 are repeated, thereby easily causing movement displacement. In this manner, after the occurrence of the movement displacement, recognition device 20 recognizes the positional relationship between nozzle 11 and target components 91. That is, amount D of pickup displacement (see FIG. 4) obtained by recognition device 20 includes amount G of displacement generated by the movement after nozzle 11 has picked up target components 91. Specifically, amount D of pickup displacement corresponds to the sum of amount F of displacement at the time of pickup and amount G of displacement caused by the movement. Amount G of displacement caused by the movement depends on the volume (or the weight) of target component 91 and the moving speed of head 18.

True amount E of displacement according to this embodiment is the sum of amount D of pickup displacement and amount C of correction as in Embodiment 1. Amount D of pickup displacement is here the sum of amount F of pickup displacement at the time of pickup and amount G of movement displacement.

Statistical processor 53 performs the maximum likelihood estimation of the parameters of the statistical model with amount G of movement displacement taken into consideration. Specifically, statistical processor 53 performs the maximum likelihood estimation on assumption that true amount $True_{zure}$ of displacement calculated for each component depends on normal distribution N as indicated by expression (7) instead of expression (1) described in Embodiment 1.

$$True_{zure} \sim N(feeder[n]+nozzle[n]+move[n]+ \ldots, \sigma) \quad (7)$$

In expression (7), feeder [n] and nozzle [n] are the same as in Embodiment 1. In addition, the probability distribution is not limited to the normal distribution but may be the Student's t-distribution, the Cauchy distribution, or the Laplace distribution.

Expression (7) may include a plurality of terms of move [n] depending on the moving path of head 18. For example, assume that head 18 holds a plurality of nozzles 11 to pick up a plurality of target components 91. Depending on the number of acceleration and deceleration occurring after target nozzles 11 have picked up target components 91 until recognition device 20 recognizes the nozzles, the terms of move [n] are added.

Move [n] is represented by the product of the volume of target component 91, the moving speed of nozzle 11, and predetermined movement parameters, for example. The movement parameters are determined by the Bayesian estimation or the maximum likelihood estimation using a normal distribution as the prior distribution.

As described above, this embodiment performs the statistical processing with amount G of movement displacement caused by the movement of nozzle 11 after picking up target component 91 taken into consideration. This increases the accuracy in analyzing the cause(s) for the pickup displacement and thus increases the accuracy of the first degree of malfunction. Since the accuracy in determining whether there is a need for maintenance increases, decreases in the productivity and quality of products can be reduced.

Note that the term(s) of move [n] may also be added in expressions (2) to (6) described in Embodiment 1 and the variation thereof.

Other Embodiments

The management device, the management method, and the component mounting system according to one or more aspects have been described based on the embodiments. The present disclosure is however not limited to these embodiments. The present disclosure includes other embodiments, such as those obtained by variously modifying the embodiments as conceived by those skilled in the art or those achieved by freely combining the constituent elements in the different embodiments without departing from the scope and spirit of the present disclosure.

For example, in the embodiments described above, the elements causing the displacement are feeders, nozzles, and movement displacement. Similarly, other elements, such as the component types or the heads, causing the displacement may be added.

For example, management device 50 may not compare the degrees of malfunction to the threshold(s). For example, management device 50 may store storage information 41 including the degrees of malfunction calculated for the constituent elements. Accordingly, for example, another terminal device may be utilized to read the degrees of malfunction from memory 40 to compare the degrees of malfunction to the threshold(s).

For example, management device 50 may include memory 40. Memory 40 may be a storage device detachably attached to management device 50.

For example, management device 50 may include no storage 51. For example, control device 30 of component mounter 10 may store, in memory 40, the element information, amount D of pickup displacement, and amount C of correction in association with each component.

(1) Each of the devices described above may be a computer system including, specifically, a microprocessor, a read-only memory (ROM), a random-access memory (RAM), a hard disk unit, or a display unit. The RAM or the hard disk unit stores computer programs. The microprocessor operates in accordance with the computer programs to cause the devices to fulfill the functions. The computer programs are here obtained by combining instruction codes indicating instructions to the computer to fulfill predetermined functions.

(2) Some or all of the constituent elements of each of the devices described above may serve as a single system large-scale integrated (LSI) circuit. The system LSI circuit is a super multifunctional LSI circuit manufactured by integrating a plurality of components on a single chip, and specifically is a computer system including a microprocessor, a ROM, and a RAM, for example. The RAM stores computer programs. The microprocessor operates in accordance with the computer programs so that the system LSI circuit fulfils the function.

(3) Some or all of the constituent elements of each of the devices described above may serve as an IC card or a single module detachably attached to the device. The IC card or the module is a computer system including a microprocessor, a ROM, and a RAM, for example. The IC card or the module may include the super multifunctional LSI circuit described above. The microprocessor operates in accordance with the computer programs so that the IC card or the module fulfils the function. This IC card or this module may have a tamper resistance.

(4) The present disclosure may be directed to the method described above. The present disclosure may also be directed to a computer program causing a computer to execute this method or digital signals indicating computer programs.

(5) The present disclosure may be directed to a computer readable storage medium capable of recording computer programs or digital signals, for example, a flexible disk, hard disk, a CD-ROM, an MO, a DVD, a DVD-ROM, a DVD-RAM, a Blu-ray Disk (BD, registered trademark), or a semiconductor memory, for example. The present disclosure may be directed to the digital signals stored in these recording media.

(6) In the present disclosure, computer programs or digital signals may be transferred via telecommunication lines, wireless or wired communication lines, networks represented by the internet, or data broadcasts, for example.

(7) The present disclosure may be directed to a computer system including a microprocessor and a memory. The memory may store the computer programs described above, whereas the microprocessor may operate in accordance with the computer programs.

(8) The programs or the digital signals may be stored in a storage medium and then transferred, or may be transferred via a network, so as to be executed by another independent computer system.

Various modifications, substitutions, additions, and omissions can be made to the embodiments described above within the scope of the claims or a scope equivalent thereto.

INDUSTRIAL APPLICABILITY

The present disclosure is applicable to a management device, for example, capable of supporting proper determination on whether there is a need for maintenance for each of constituent elements of a component mounter and to manufacture management in a factory, for example.

The invention claimed is:

1. A management device for managing a component mounter that mounts a plurality of components onto a substrate using some of a plurality of constituent elements each selected from one of a plurality of constituent element groups each including the plurality of constituent elements, one of the plurality of constituent element groups being a nozzle group including a plurality of nozzles, the management device comprising circuitry configured to perform as:
a calculator that calculates, for each of target components which are the plurality of components, a true amount of displacement which is a sum of (i) an amount of pickup displacement which is an amount of displacement between the target component and a target nozzle that is one of the plurality of nozzles and picks up the target component and (ii) an amount of correction which is an amount of offset of a position of the target nozzle when picking up the target component;
a statistical processor that performs parameter estimation for a predetermined statistical model using the true amount of displacement to calculate a first degree of malfunction of each of the plurality of constituent elements; and
an outputter that compares the first degree of malfunction with a threshold to determine that the first degree exceeds the threshold, and outputs a maintenance instruction in relation to corresponding one of the plurality of constituent elements, in response to determining that the first degree exceeds the threshold,
wherein the component mounter includes:
a head that holds the plurality of nozzles;
a head control device that controls a movement of the head; and
an imaging device attached to the head,
wherein the outputter further outputs a predetermined signal to the head control device, when the first degree of malfunction exceeds the threshold, and
wherein upon receipt of the predetermined signal, the head control device moves the head to cause the imaging device to perform imaging to generate an image.

2. The management device according to claim 1, wherein the amount of pickup displacement includes an amount of displacement caused by a movement after the target nozzle has picked up the target component.

3. The management device according to claim 1, wherein the parameter estimation is maximum likelihood estimation or maximum a posteriori probability estimation.

4. The management device according to claim 1, wherein the outputter outputs, when the first degree of malfunction exceeds the threshold, information indicating one of the plurality of constituent elements associated with the first degree of malfunction that has exceeded the threshold determined.

5. The management device according to claim 1, further comprising:
a storage that stores, in a memory, element information indicating a combination of the plurality of constituent elements used for mounting the target component and including the target nozzle, the amount of pickup displacement, and the amount of correction in association with each other for each of the target components.

6. A component mounting system comprising:
the management device according to claim 1; and
the component mounter.

7. A management method of managing a component mounter that mounts a plurality of components onto a substrate using some of a plurality of constituent elements each selected from one of a plurality of constituent element groups each including the plurality of constituent elements, one of the plurality of constituent element groups being a nozzle group including a plurality of nozzles, the management method comprising:
obtaining an amount of pickup displacement being an amount of displacement between a target component being one of the plurality of components and a target nozzle that is one of the plurality of nozzles and picks up the target component;
obtaining an amount of correction being an amount of offset of a position of the target nozzle when picking up the target component;
calculating a true amount of displacement that is a sum of the amount of pickup displacement and the amount of correction;
performing parameter estimation for a predetermined statistical model using the true amount of displacement to calculate a degree of malfunction of each of the plurality of constituent elements;
comparing the degree of malfunction with a threshold to determine that the degree exceeds the threshold, and
outputting a maintenance instruction in relation to corresponding one of the plurality of constituent elements, in response to determining that the degree exceeds the threshold,
wherein the component mounter includes:
a head that holds the plurality of nozzles;
a head control device that controls a movement of the head; and
an imaging device attached to the head,
wherein the management method further comprises:
outputting a predetermined signal to the head control device, when the degree of malfunction exceeds the threshold, and
in response to the predetermined signal, moving the head, by the head control device, to cause the imaging device to perform imaging to generate an image.

8. A non-transitory computer-readable storage medium storing a program for causing a computer to execute the management method according to claim 7.

9. A management device for managing a component mounter that mounts a plurality of components onto a substrate using some of a plurality of constituent elements each selected from one of a plurality of constituent element groups each including the plurality of constituent elements, one of the plurality of constituent element groups being a nozzle group including a plurality of nozzles, the management device comprising circuitry configured to perform as:

a calculator that calculates, for each of target components which are the plurality of components, a true amount of displacement which is a sum of (i) an amount of pickup displacement which is an amount of displacement between the target component and a target nozzle that is one of the plurality of nozzles and picks up the target component and (ii) an amount of correction which is an amount of offset of a position of the target nozzle when picking up the target component; and a statistical processor that performs parameter estimation for a predetermined statistical model using the true amount of displacement to calculate a first degree of malfunction of each of the plurality of constituent elements, wherein another one of the plurality of constituent element groups is a feeder group including a plurality of feeders, the management device further comprises an obtainer that obtains an amount of displacement of at least one of feeding mechanisms of the plurality of feeders, when the first degree of malfunction exceeds a first threshold determined in advance, the statistical processor further performs statistical processing using the amount of displacement obtained by the obtainer to calculate a second degree of malfunction, the management device further comprises an outputter that outputs a maintenance instruction, when the second degree of malfunction exceeds a second threshold determined in advance, and the component mounter includes:
a head that holds the plurality of nozzles;
a head control device that controls a movement of the head; and
an imaging device attached to the head, the outputter further outputs a predetermined signal to the head control device, when the first degree of malfunction exceeds the first threshold, and upon receipt of the predetermined signal, the head control device moves the head to cause the imaging device to perform imaging to generate an image.

10. The management device according to claim 9, wherein the image contains the at least one of feeding mechanisms, and the obtainer obtains the amount of displacement of the at least one of feeding mechanisms based on the image generated by the imaging device.

* * * * *